US010461171B2

United States Patent
Hsiao et al.

(10) Patent No.: US 10,461,171 B2
(45) Date of Patent: Oct. 29, 2019

(54) STRUCTURE AND FORMATION METHOD OF SEMICONDUCTOR DEVICE WITH METAL GATE STACKS

(71) Applicant: Taiwan Semiconductor Manufacturing Co., Ltd., Hsinchu (TW)

(72) Inventors: Yi-Hsuan Hsiao, Taipei (TW); Shu-Yuan Ku, Zhubei (TW); Chih-Chang Hung, Hsinchu (TW); I-Wei Yang, Yilan County (TW); Chih-Ming Sun, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/965,183

(22) Filed: Apr. 27, 2018

(65) Prior Publication Data

US 2019/0221653 A1 Jul. 18, 2019

Related U.S. Application Data

(60) Provisional application No. 62/616,685, filed on Jan. 12, 2018.

(51) Int. Cl.
*H01L 29/66* (2006.01)
*H01L 29/78* (2006.01)
*H01L 29/417* (2006.01)
*H01L 29/06* (2006.01)

(52) U.S. Cl.
CPC .... *H01L 29/66545* (2013.01); *H01L 29/0649* (2013.01); *H01L 29/41791* (2013.01); *H01L 29/66795* (2013.01); *H01L 29/7855* (2013.01)

(58) Field of Classification Search
CPC ......... H01L 29/66545; H01L 29/41789; H01L 29/7855
USPC .......................................................... 257/365
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |

(Continued)

*Primary Examiner* — Igwe U Anya
(74) *Attorney, Agent, or Firm* — Birch, Stewart, Kolasch & Birch, LLP

(57) ABSTRACT

A method for forming a semiconductor device structure includes forming a first dummy gate stack and a second dummy gate stack over a semiconductor substrate and forming a dielectric layer over the semiconductor substrate to surround the first dummy gate stack and the second dummy gate stack. The method includes removing the first dummy gate stack and the second dummy gate stack to form a first trench and a second trench in the dielectric layer and removing the first dummy gate stack and the second dummy gate stack to form a first trench and a second trench in the dielectric layer. The method includes partially removing the first metal gate stack, the second metal gate stack, and the dielectric layer to form a recess. The method includes forming an insulating structure to partially or completely fill the recess.

20 Claims, 22 Drawing Sheets

(56) References Cited

U.S. PATENT DOCUMENTS

| | | | |
|---|---|---|---|
| 9,245,805 B2 | 1/2016 | Yeh et al. | |
| 9,520,482 B1 | 12/2016 | Chang et al. | |
| 9,553,090 B2 * | 1/2017 | Chang | H01L 29/785 |
| 9,576,814 B2 | 2/2017 | Wu et al. | |
| 10,079,289 B2 * | 9/2018 | Lee | H01L 29/4958 |
| 2015/0214227 A1 * | 7/2015 | Kim | H01L 27/0924 |
| | | | 257/369 |
| 2015/0348965 A1 | 12/2015 | Chang et al. | |
| 2016/0351568 A1 * | 12/2016 | Chang | H01L 29/785 |
| 2017/0141210 A1 * | 5/2017 | Yang | H01L 29/66795 |
| 2018/0308956 A1 * | 10/2018 | Chang | H01L 29/785 |
| 2019/0067301 A1 * | 2/2019 | Yang | H01L 27/1116 |

* cited by examiner

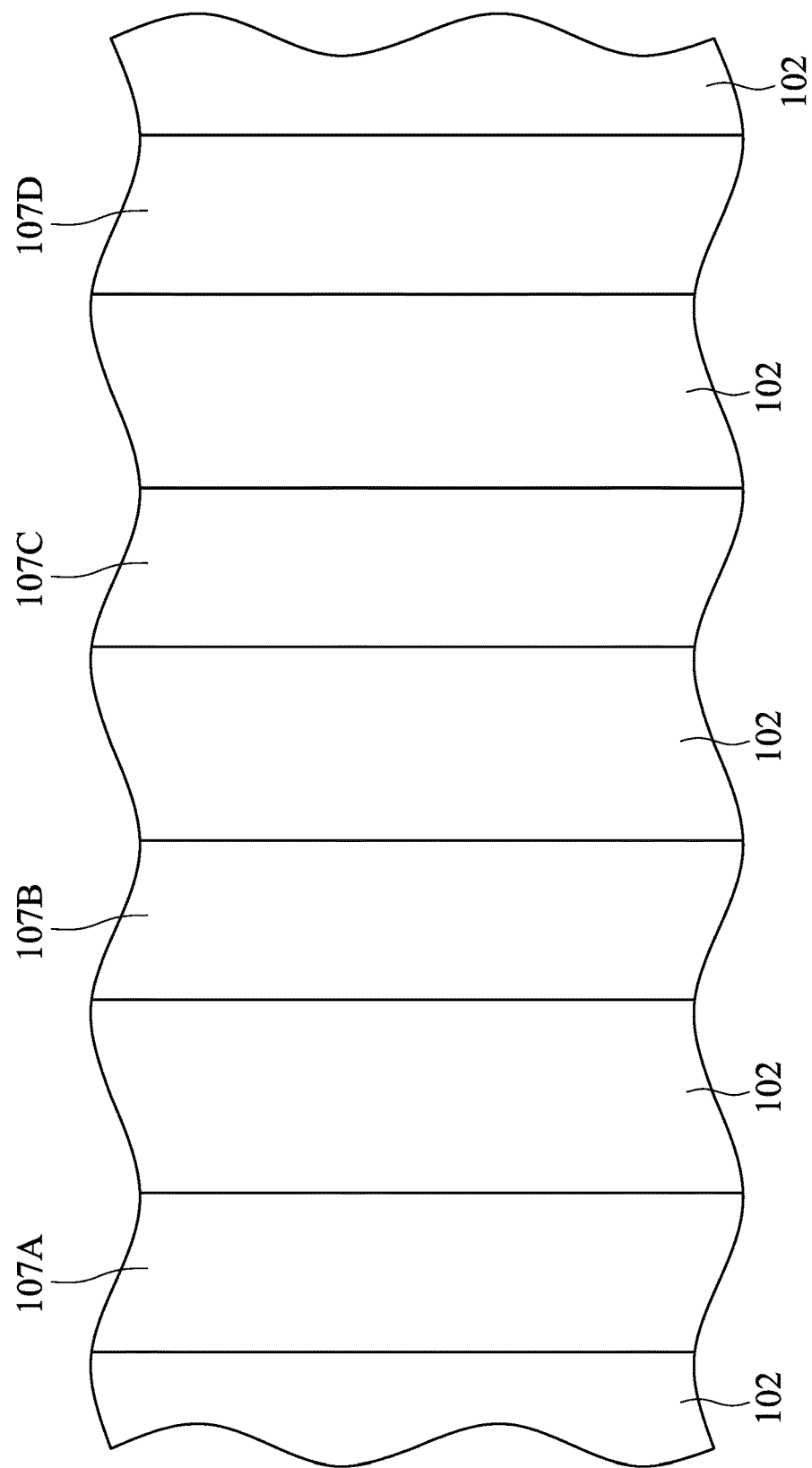

STRUCTURE AND FORMATION METHOD OF SEMICONDUCTOR DEVICE WITH METAL GATE STACKS

PRIORITY CLAIM AND CROSS-REFERENCE

This Application claims the benefit of U.S. Provisional Application No. 62/616,685, filed on Jan. 12, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2F are top views of various stages of a process for forming a semiconductor device structure, in accordance with some embodiments.

DETAILED DESCRIPTION

Figure 1A:
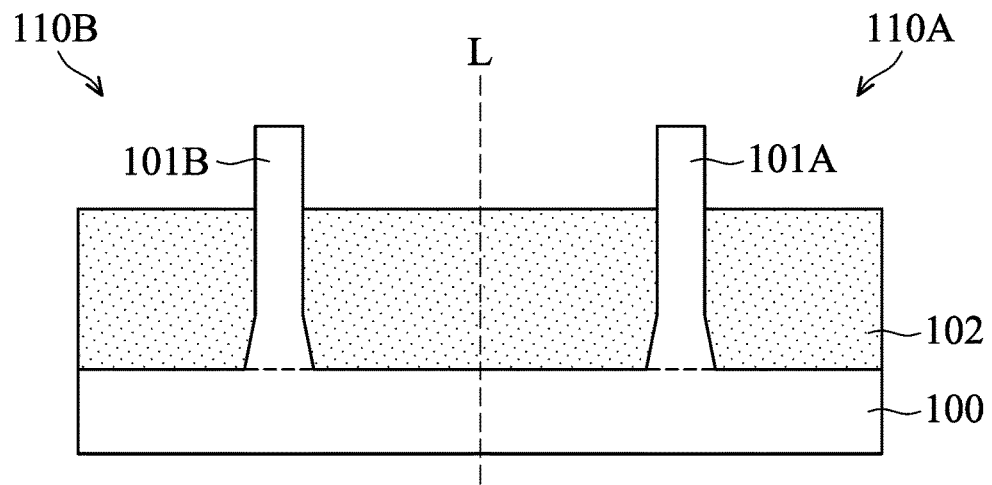
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

In some embodiments, multiple dummy gate stacks (including a first dummy gate stack and a second dummy gate stack) are formed over a semiconductor substrate. The dummy gate stacks may extend over multiple fin structures. In some embodiments, a dielectric layer is formed to surround the first dummy gate stack and the second dummy gate stack.

Afterwards, a gate replacement process is used to form metal gate stacks to replace the dummy gate stacks. In some embodiments, the first dummy gate stack and the second dummy gate stack are removed to form a first trench and a second trench. In some embodiments, gate dielectric layers, work function layers, and metal fillings are formed in the first trench and the second trenches to form a first metal gate stack and a second metal gate stack. Multiple deposition processes and one or more planarization processes may be used to form the metal gate stacks.

In some embodiments, a mask element is formed. The mask element has an opening that exposes a portion of the first metal gate stack, a portion of the dielectric layer, and a portion of the second metal gate stack. The top view of the opening may be rectangular, oval, or square.

In some embodiments, the first metal gate stack, the second metal gate stack, and the dielectric layer are partially removed to form a recess. The recess may also be called a cut-metal-gate (CMG) opening. The CMG opening penetrates through the first metal gate stack and the second metal gate stack. The CMG opening separates the first metal gate stack into two sections. Two metal gate stacks are thus formed by cutting the first metal gate stack. The CMG opening also separates the second metal gate stack into two sections. Two metal gate stacks are thus formed by cutting the second metal gate stack. In some embodiments, the CMG opening is formed using an etching process with the mask element as an etching mask.

In some embodiments, the etching process for forming the CMG opening involves using one or more etchant gas such as $BCl_3$, $Cl_2$, and $SiCl_4$. In some embodiments, an overetching process is used to ensure the two metal gate stacks obtained from cutting the first metal gate stacks are not in electrical contact with each other. Short circuiting therebetween is therefore prevented.

In some embodiments, the CMG opening has an oval-like top view shape. In some embodiments, the CMG opening has a first width near a center line of the first metal gate. The CMG opening may also have a second width near an edge of the first metal gate. In some embodiments, the first width is greater than the second width.

Aspects of the embodiments of the disclosure are illustrated in more detail when read with the accompanying figures.

FIGS. 1A-1I are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some other embodiments, the semiconductor substrate 100 includes a compound semiconductor. The compound semiconductor may include silicon carbide, gallium arsenide, indium arsenide, indium phosphide, one or more other suitable compound semiconductors, or a combination thereof. In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, the semiconductor substrate 100 includes multiple portions (including portions 110A and 110B) defined by an imaginary line L. In some embodiments, multiple transistors are formed or to be formed in and/or over the portions 110A and 110B of the semiconductor substrate 100. In some embodiments, a p-type metal-oxide-semiconductor field effect transistor (PMOSFET) and an n-type metal-oxide-semiconductor field effect transistor (NMOSFET) will be formed in and/or over the portions 110A and 110B, respectively. In some other embodiments, an NMOSFET and a PMOSFET will be formed in and/or over the portions 110A and 110B, respectively. In some other embodiments, NMOSFETs will be formed in and/or over the portions 110A and 110B. In some other embodiments, PMOSFETs will be formed in and/or over the portions 110A and 110B.

As shown in FIG. 1A, multiple recesses (or trenches) are formed in the semiconductor substrate 100, in accordance with some embodiments. As a result, multiple fin structures including fin structures 101A and 101B are formed or defined between the recesses. In some embodiments, one or more photolithography and etching processes are used to form the recesses. In some embodiments, the fin structures 101A and 101B are in direct contact with the semiconductor substrate 100.

However, embodiments of the disclosure have many variations and/or modifications. In some other embodiments, the fin structures 101A and 101B are not in direct contact with the semiconductor substrate 100. One or more other material layers may be formed between the semiconductor substrate 100 and the fin structures 101A and 101B. For example, a dielectric layer may be formed therebetween.

As shown in FIG. 1A, isolation features 102 are formed in the recesses to surround lower portions of the fin structures 101A and 101B, in accordance with some embodiments. The isolation features 102 are used to define and electrically isolate various device elements formed in and/or over the semiconductor substrate 100. In some embodiments, the isolation features 102 include shallow trench isolation (STI) features, local oxidation of silicon (LOCOS) features, another suitable isolation feature, or a combination thereof.

In some embodiments, each of the isolation features 102 has a multi-layer structure. In some embodiments, the isolation features 102 are made of a dielectric material. The dielectric material may include silicon oxide, silicon nitride, silicon oxynitride, fluoride-doped silicate glass (FSG), low-K dielectric material, one or more other suitable materials, or a combination thereof. In some embodiments, an STI liner (not shown) is formed to reduce crystalline defects at the interface between the semiconductor substrate 100 and the isolation features 102. Similarly, the STI liner may also be used to reduce crystalline defects at the interface between the fin structures and the isolation features 102.

In some embodiments, a dielectric material layer is deposited over the semiconductor substrate 100. The dielectric material layer covers the fin structures including the fin structures 101A and 101B and fills the recesses between the fin structures. In some embodiments, the dielectric material layer is deposited using a chemical vapor deposition (CVD) process, an atomic layer deposition (ALD) process, a physical vapor deposition (PVD) process, a spin-on process, one or more other applicable processes, or a combination thereof. In some embodiments, a planarization process is used to thin down the dielectric material layer until the fin structures 101A and 101B or hard mask elements defining the fin structures are exposed. The planarization process may include a chemical mechanical polishing (CMP) process, a grinding process, a dry polishing process, an etching process, one or more other applicable processes, or a combination thereof. Afterwards, the dielectric material layer is etched back such that the fin structures including the fin structures 101A and 101B protrude from the top surface of the etched dielectric material layer. As a result, the isolation features 102 are formed.

Figure 1B:
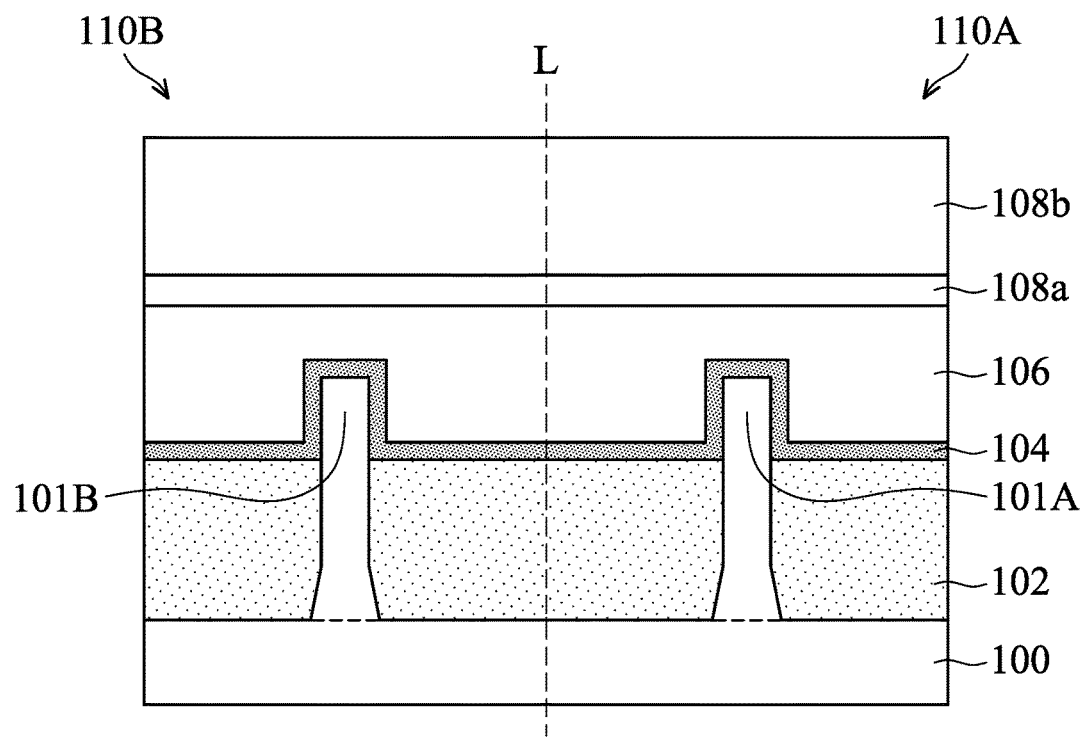

As shown in FIG. 1B, a gate dielectric layer 104 and a dummy gate electrode layer 106 are deposited over the isolation features 102 and the fin structures 101A and 101B, in accordance with some embodiments. In some embodiments, the gate dielectric layer 104 is made of or includes silicon oxide, silicon nitride, silicon oxynitride, dielectric material with a high dielectric constant (high-K), one or more other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. In some embodiments, the gate dielectric layer 104 is a dummy gate dielectric layer which will be removed subsequently. The dummy gate dielectric layer is, for example, a silicon oxide layer.

In some embodiments, the gate dielectric layer 104 is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the dummy gate electrode layer 106 is made of or includes a semiconductor material such as polysilicon. For example, the dummy gate electrode layer 106 is deposited using a CVD process or other applicable processes.

Many variations and/or modifications can be made to embodiments of the disclosure. In some embodiments, the gate dielectric layer 104 is not formed.

Afterwards, a patterned hard mask layer is formed over the dummy gate electrode layer 106, as shown in FIG. 1B in accordance with some embodiments. The patterned hard mask layer is used to pattern the dummy gate electrode layer 106 and the gate dielectric layer 104 into one or more dummy gate stacks (or dummy gate stack lines). In some embodiments, the patterned hard mask layer includes a first hard mask layer 108a and a second hard mask layer 108b. In some embodiments, the first hard mask layer 108a is made of or includes silicon nitride. In some embodiments, the second hard mask layer 108b is made of or includes silicon oxide. In some embodiments, the second hard mask layer 108b is thicker than the first hard mask layer 108a.

In some embodiments, the dummy gate stacks are multiple dummy gate stack lines formed over the isolation features 102 and the fin structures 101A and 101B. In some embodiments, the dummy gate stack lines are substantially parallel to each other. In some embodiments, each of the dummy gate stacks (or dummy gate stack lines) is formed into two or more gate stacks in subsequent processes.

In some embodiments, a patterned photoresist layer (not shown) is used to assist in the formation of the patterned hard mask layer. The patterned photoresist layer is formed using one or more photolithography processes. The photolithography processes may include photoresist coating (e.g., spin-on coating), soft baking, mask aligning, exposure, post-exposure baking, developing the photoresist, rinsing, drying (e.g., hard baking), one or more other suitable processes, or a combination thereof.

Figure 1C:
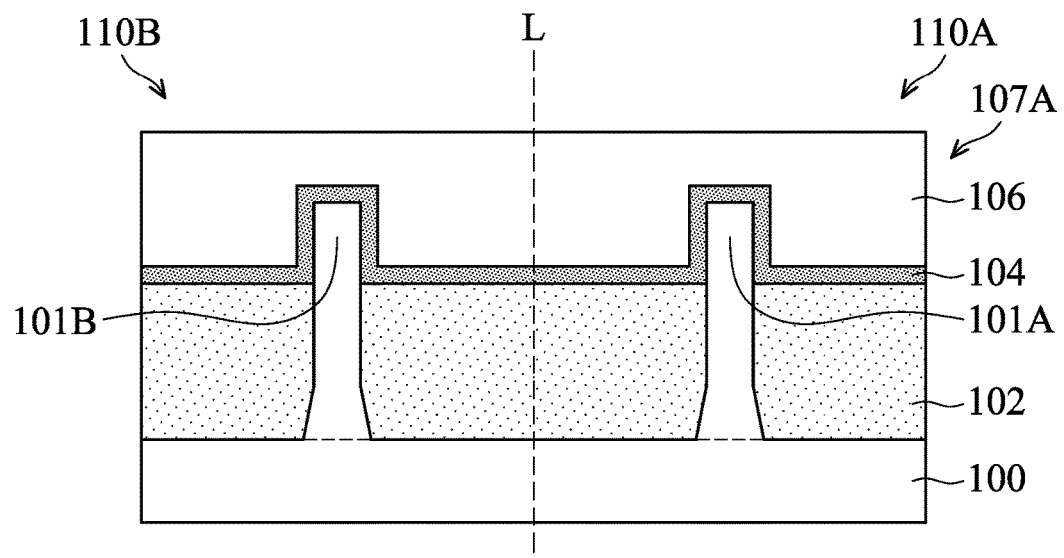

Afterwards, the dummy gate electrode layer 106 and the gate dielectric layer 104 are patterned to form one or more dummy gate stacks including a dummy gate stack 107A, as shown in FIG. 1C in accordance with some embodiments. In some embodiments, the hard mask layers 108a and 108b are removed afterwards.

Figure 2B:
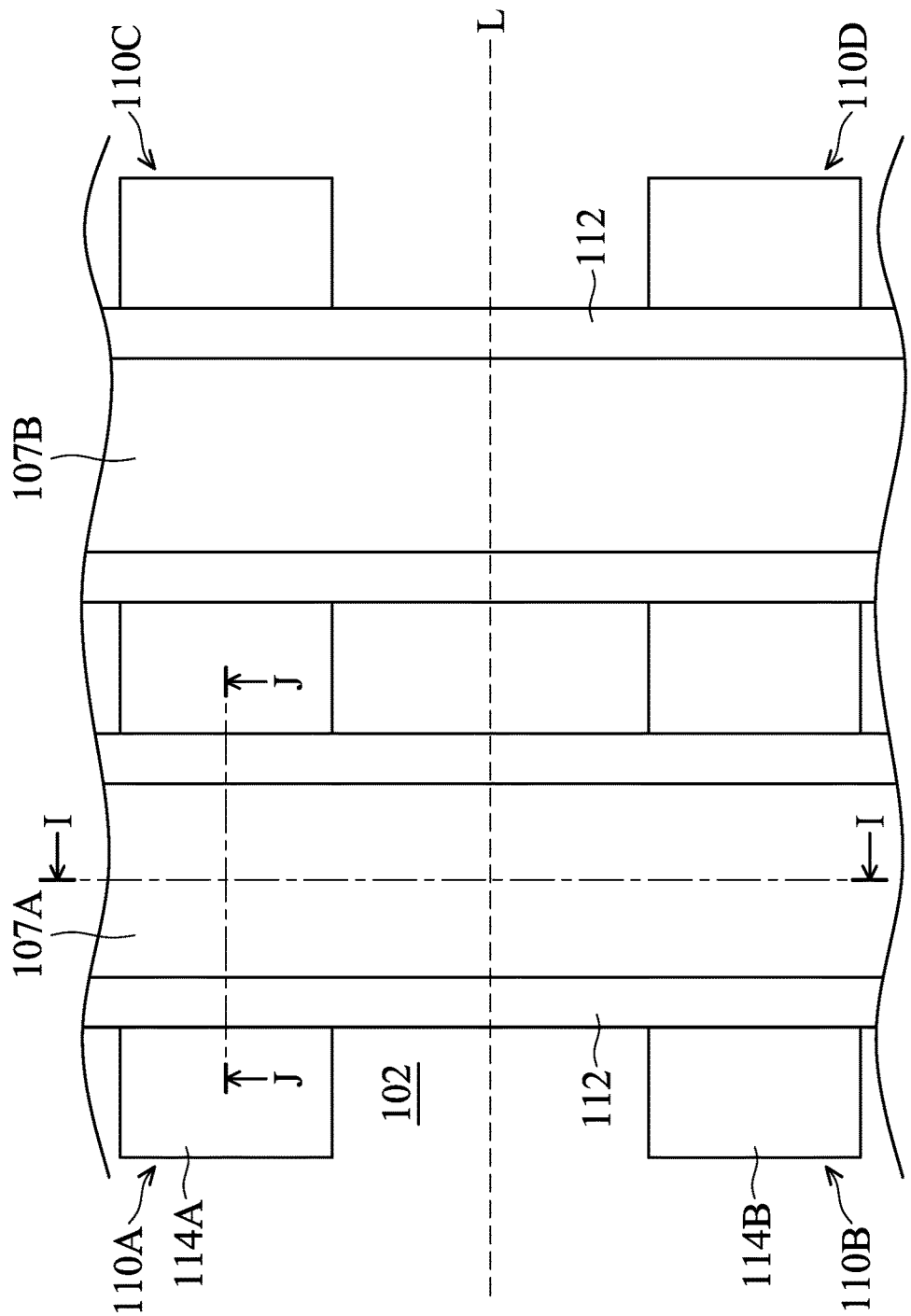

FIGS. 2A-2F are top views of various stages of a process for forming a semiconductor device structure, in accordance with some embodiments. In some embodiments, FIG. 2A is a top view of the structure shown in FIG. 1C and other portions that are not shown in FIG. 1C. As shown in FIG. 2A, multiple dummy gate stacks including 107A-107D are formed, in accordance with some embodiments. Each of the dummy gate stacks 107A-107D includes the dummy gate electrode layer 106 and the gate dielectric layer 104.

Figure 3:
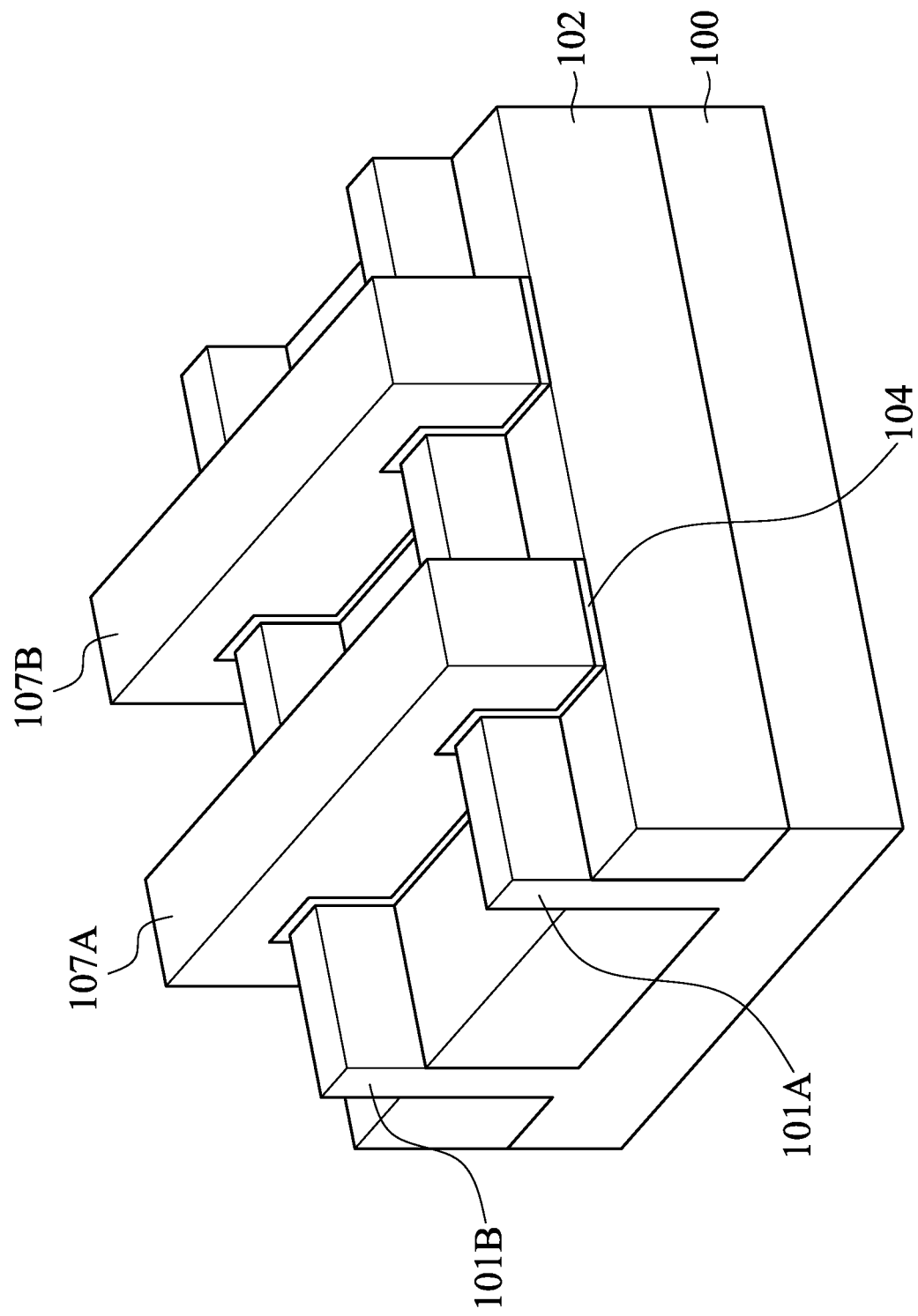
FIG. 3 is a perspective view of an intermediate stage of a process for forming a semiconductor device structure, in accordance with some embodiments.

FIG. 3 is a perspective view of an intermediate stage of a process for forming a semiconductor device structure, in accordance with some embodiments. In some embodiments, FIG. 3 is a perspective view showing a portion of the structure shown in FIG. 1C or 2A.

Figure 4A:
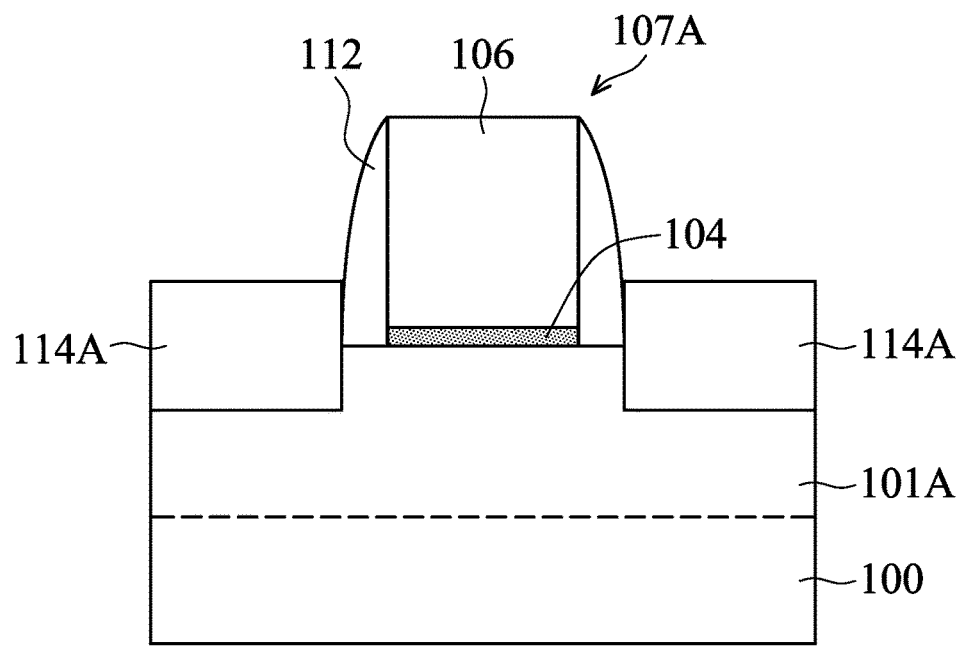
FIGS. 4A-4C are cross-sectional views of various stages of a process for forming a semiconductor device structure, in accordance with some embodiments.
Figure 4B:
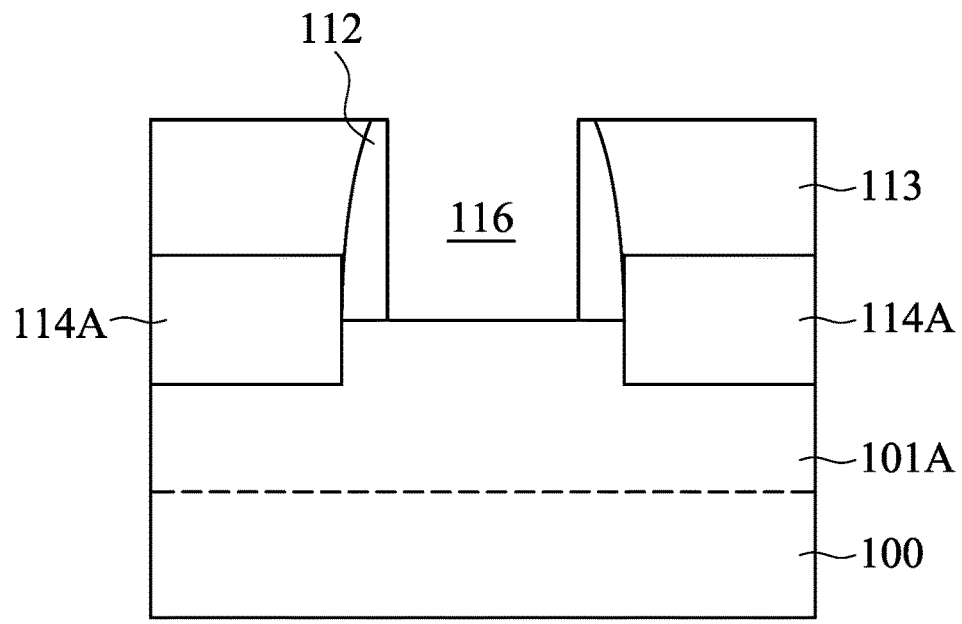
Figure 4C:
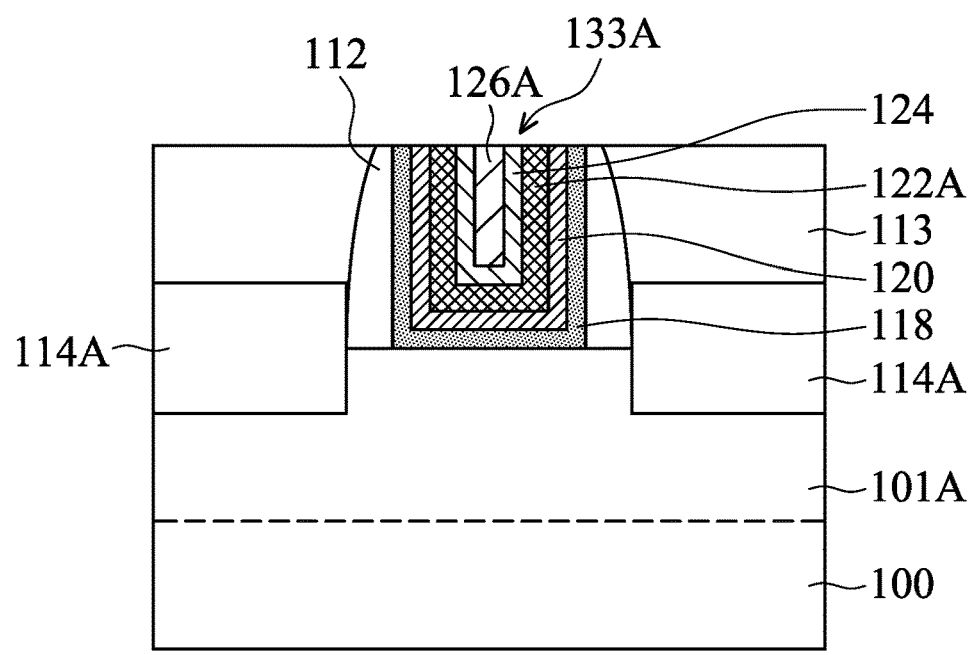
Figure 5:
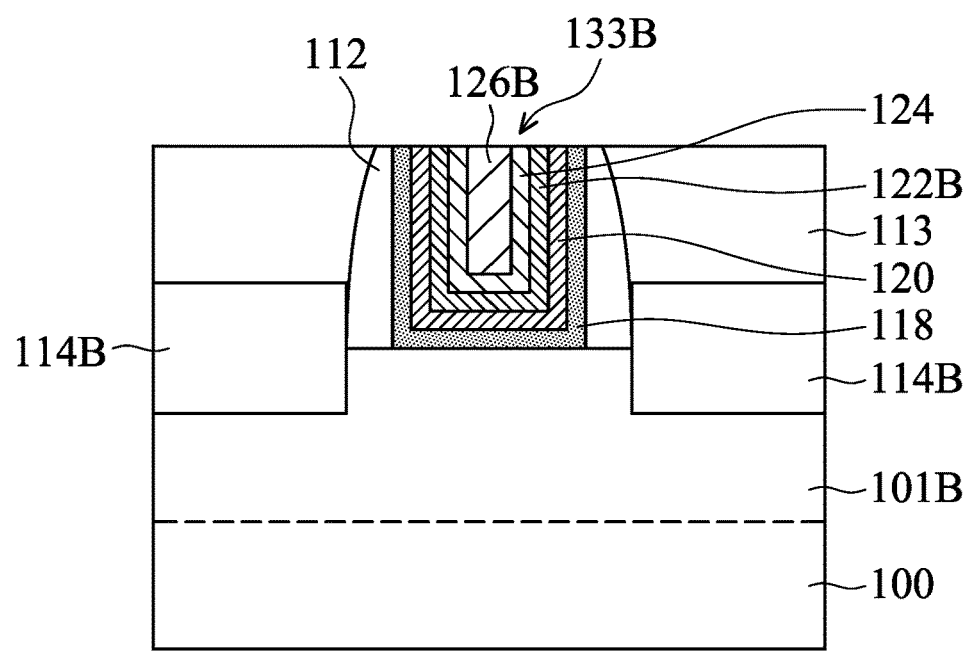
FIG. 5 is a cross-sectional view of an intermediate stage of a process for forming a semiconductor device structure, in accordance with some embodiments.

Afterwards, source/drain structures are formed over the fin structures 101A and 101B and adjacent to the dummy gate stack 107A, in accordance with some embodiments. FIGS. 4A-4C are cross-sectional views of various stages of a process for forming a semiconductor device structure, in accordance with some embodiments. FIG. 5 is a cross-sectional view of an intermediate stage of a process for forming a semiconductor device structure, in accordance with some embodiments. FIGS. 1C-1I are some cross-sectional views taken along the line I-I of FIGS. 2B-2F. In some embodiments, FIGS. 4A-4C are some cross-sectional views taken along the line J-J of FIGS. 2B-2F, and FIG. 5 is a cross-sectional view taken along the line K-K of FIG. 2F.

As shown in FIG. 2B or 4A, source/drain structures 114A and 114B are formed over the semiconductor substrate 100 and adjacent to the dummy gate stack 107A, in accordance with some embodiments. As shown in FIG. 2B, in some embodiments, multiple transistors are formed in and/or over the portions 110A, 110B, 110C, and 110D of the semiconductor substrate 100. The source/drain structures 114A are a portion of the transistor formed in and/or over the portion 110A, and the source/drain structure 114B are a portion of another transistor formed in and/or over the portion 110B.

In some embodiments, the fin structures 101A and 101B are recessed to be lower than top surfaces of the isolation features 102, in accordance with some embodiments. In some embodiments, an etching process is performed to remove upper portions of the fin structures 101A and 101B. As a result, recesses are formed above the fin structures 101A (and 101B), as shown in FIG. 4A. In some other embodiments, multiple etching operations are used so that the recesses further extend laterally towards channel regions below the dummy gate stack 107A.

In some embodiments, a semiconductor material (or two or more semiconductor materials) is epitaxially grown over the fin structures that are recessed, growing continually to above the recesses, to form the source/drain structures 114A and 114B. In some embodiments, the growth of the source/drain structures 114A and 114B are performed simultaneously. In some embodiments, the growth of the source/drain structures 114A and 114B are performed separately in different processes.

In some embodiments, the source/drain structures 114A are a p-type semiconductor material. For example, the source/drain structures 114A may include epitaxially grown silicon germanium. The source/drain structures 114A are not limited to being a p-type semiconductor material. In some embodiments, the source/drain structures 114A are an n-type semiconductor material. The source/drain structures 114A may include epitaxially grown silicon, epitaxially grown silicon carbide (SiC), epitaxially grown silicon phosphide (SiP), or another suitable epitaxially grown semiconductor material.

In some embodiments, both of the source/drain structures 114A and 114B are p-type. In some embodiments, both of the source/drain structures 114A and 114B are n-type. In some embodiments, one of the source/drain structures 114A and 114B is p-type, and the other of the source/drain structures 114A and 114B is n-type.

In some embodiments, the source/drain structures 114A and 114B are formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof. The formation process of the source/drain structures 114A and 114B may use gaseous and/or liquid precursors. In some embodiments, both the source/drain structures 114A and 114B are grown in-situ in the same process chamber. The source/drain structures 114A and 114B may be formed using an in-situ epitaxial growth process. In some other embodiments, the source/drain structures 114A and 114B are grown separately in different process chambers.

In some embodiments, the source/drain structures 114A and 114B include dopants. In some embodiments, multiple implantation processes are performed to dope the source/drain structures 114A and 114B. In some embodiments, spacer elements 112 are formed over sidewalls of the dummy gate stack 107A to assist in the formation of the source/drain structures 114A and 114B, as shown in FIGS. 2B and 4A. In some embodiments, lightly doped source/drain regions (not shown) are formed using ion implantation processes before the spacer elements 112 are formed.

In some embodiments, the source/drain structures 114A and 114B are doped in-situ during the growth of the source/drain structures 114A and 114B. In some other embodiments, the source/drain structures 114A and 114B are not doped during the growth of the source/drain structures 114A and 114B. After the epitaxial growth, the source/drain structures 114A and 114B are doped in a subsequent process. In some embodiments, the doping is achieved using an ion implantation process, a plasma immersion ion implantation process, a gas and/or solid source diffusion process, one or more other applicable processes, or a combination thereof. In some embodiments, the source/drain structures 114A and 114B are further exposed to one or more annealing processes to activate the dopants. For example, a rapid thermal annealing process is used.

Figure 2C:
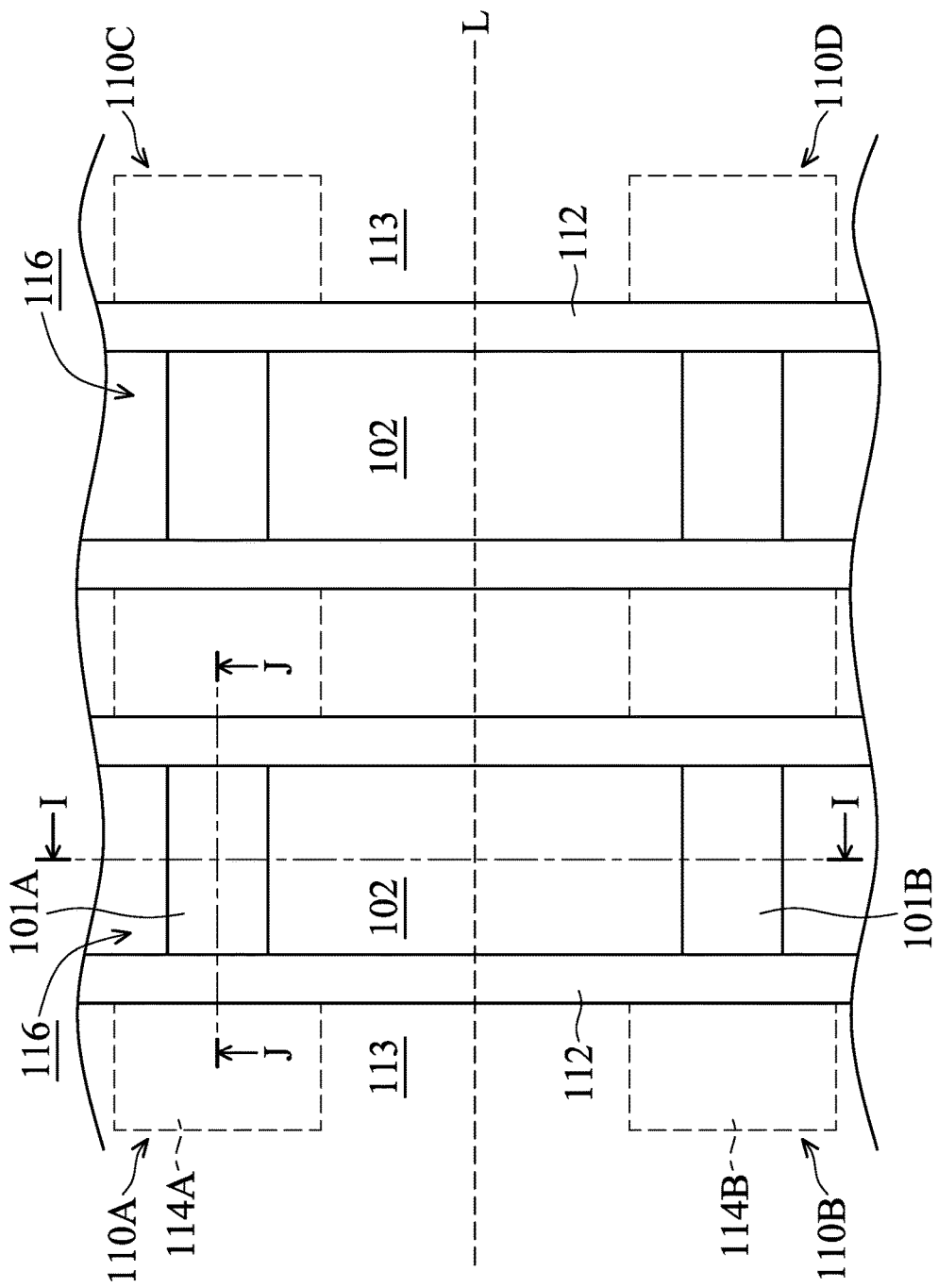

Afterwards, the dummy gate stacks including 107A and 107B are removed, in accordance with some embodiments. In some embodiments, before the removal of the dummy gate stacks 107A and 107B, a dielectric layer 113 is deposited over the semiconductor substrate 100 to surround the source/drain structures 114A and 114B and the dummy gate stacks 107A-107D, as shown in FIG. 4B. In FIG. 2C, for the sake of clarity, elements (such as the source/drain structures 114A and 114B) covered by the dielectric layer 113 are illustrated as dashed lines.

In some embodiments, the dielectric layer 113 is made of or includes silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, the dielectric layer 113 is deposited using a CVD process, an ALD process, a PVD process, a spin-on process, one or more other applicable processes, or a combination thereof.

Afterwards, the dielectric layer 113 is thinned down until the dummy gate stacks including 107A-107D are exposed. The thinned dielectric layer 113 surrounds the dummy gate stacks 107A-107D. In some embodiments, the dielectric layer 113 is thinned down using a planarization process. The planarization process may include a chemical mechanical polishing (CMP) process, a grinding process, an etching process, a dry polishing process, one or more other applicable processes, or a combination thereof. Many variations and/or modifications can be made to embodiments of the disclosure. In some other embodiments, the dielectric layer 113 is not formed.

Figure 1D:
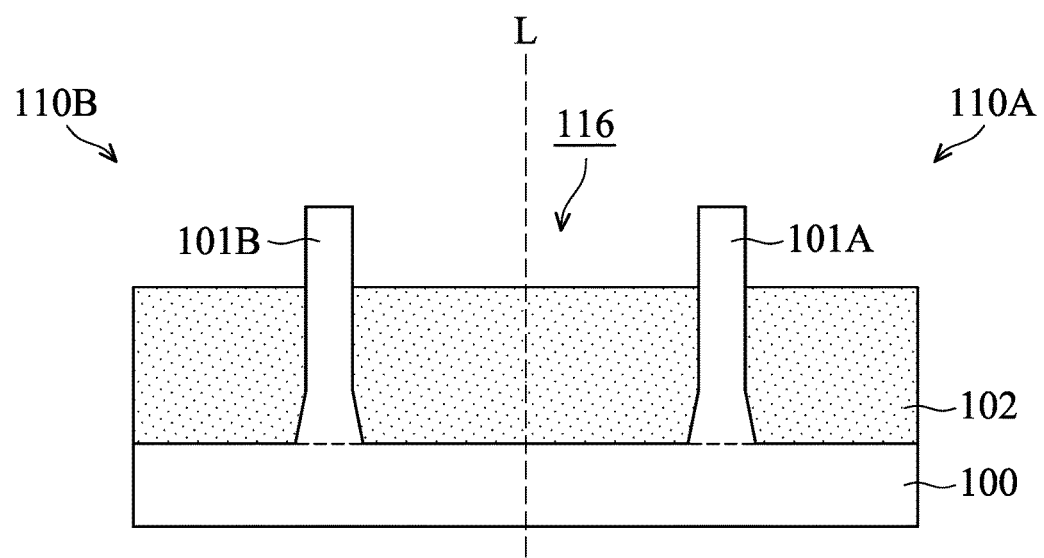

Afterwards, the dummy gate stacks 107A-107D are removed to form trenches 116 that expose the fin structures including the fin structures 101A and 101B and the isolation features 102, as shown in FIG. 1D in accordance with some embodiments. FIG. 2C shows the top view of the trenches 116. The trenches 116 expose the fin structures 101A and 101B and the isolation features 102. In some embodiments, the dielectric layer 113 is formed, and the trenches 116 are formed in the dielectric layer 113. In these cases, the dielectric layer 113 surrounds the trenches 116, as shown in FIG. 4B. In some embodiments, each of the trenches 116 is surrounded by the spacer elements 112. In some embodiments, one of the trenches 116 exposes the portions of the fin structures 101A and 101B that are originally covered by the dummy gate stacks 107A. The exposed portions of fin structures 101A and 101B may serve as channel regions.

In some embodiments, the dummy gate stacks 107A-107D are removed using a dry etching process, a wet etching process, one or more other applicable processes, or a combination thereof. In some embodiments, the gate dielectric layer 104 is made of a high-K material and is not removed. In these cases, the trenches 116 expose the gate dielectric layer 104.

Figure 1E:
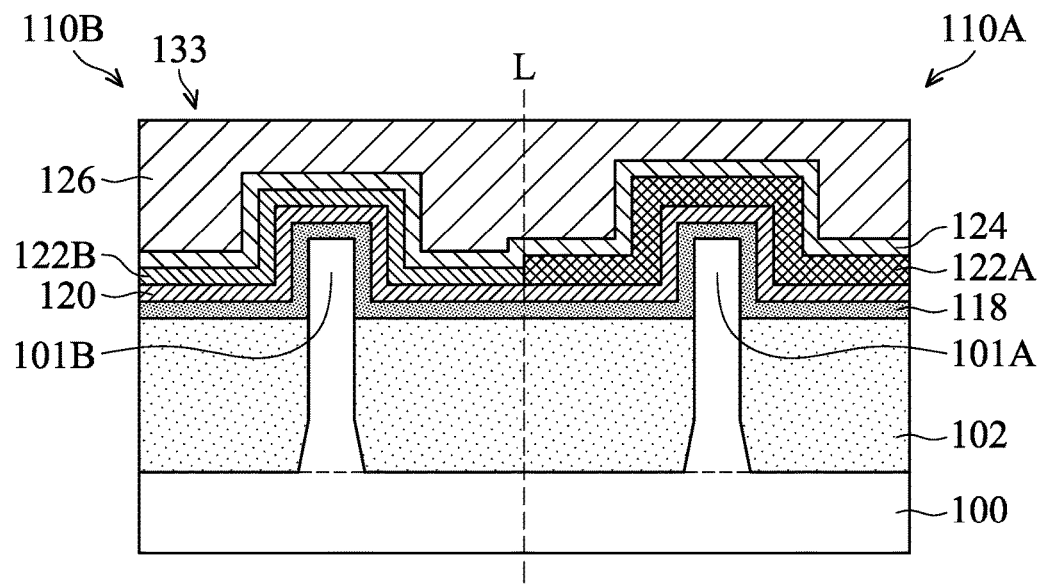
Figure 2D:
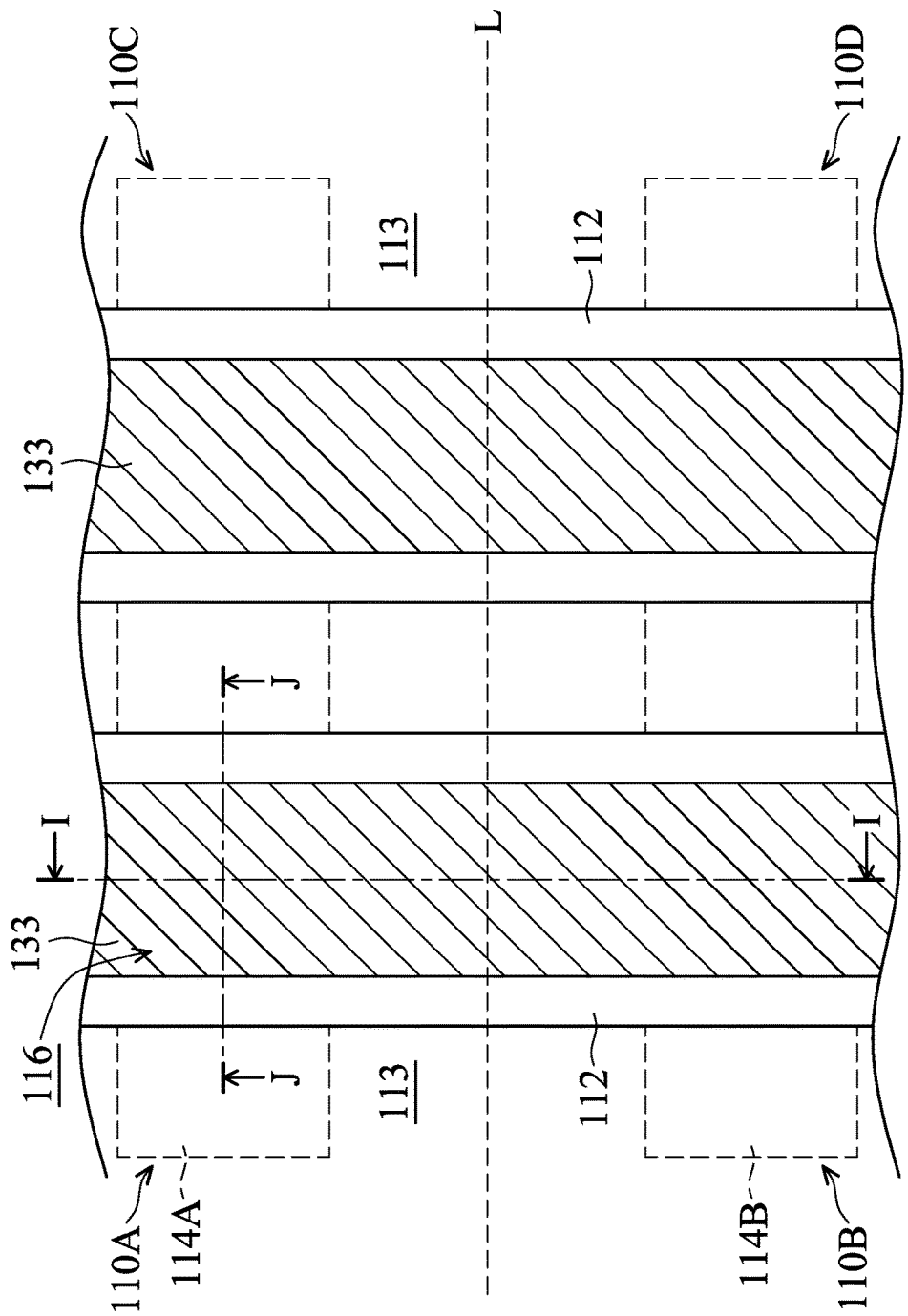

After the removal of the dummy gate stacks 107A-107D, metal gate stack layers are formed in the trenches 116, in accordance with some embodiments. The metal gate stack layers extend along sidewalls and tops of the fin structures 101A and 101B, as shown in FIG. 1E. Each of the metal gate stack layers in the trench 116 may also be called a metal gate stack line. FIG. 2D shows the top view of the metal gate stack line.

As mentioned above, in some embodiments, each of the dummy gate stacks 107A-107D (or dummy gate stack lines) will be formed into two or more gate stacks. Therefore, each of the trenches 116 formed after the removal of the dummy gate stacks 107A-107D is large enough to contain two or more metal gate stacks. The depositions or fillings of the metal gate stack layers are easier than other cases where the depositions or fillings of the metal gate stack layers are performed in a recess designed to contain only one metal gate stack. Therefore, the process window is enlarged significantly.

In some embodiments, the metal gate stack layers include a gate dielectric layer, a work function layer, and a metal filling layer. In some embodiments, two transistors are formed in and/or over the portions 110A and 110B of the semiconductor substrate 100. In some embodiments, one of the transistors is a p-type transistor, and the other one is an n-type transistor. In some embodiments, both of the transistors are p-type transistors. In some embodiments, both of the transistors are n-type transistors. In some embodiments, one or more p-type work function layers are formed over the portion 110A, and one or more n-type work function layers are formed over the portion 110B. In some embodiments, one or more n-type work function layers are formed over the portion 110A, and one or more p-type work function layers are formed over the portion 110B.

As shown in FIGS. 1E, 4C, and 5, a gate dielectric layer 118 is deposited over the sidewalls and bottom of the trench 116, in accordance with some embodiments. In some embodiments, the gate dielectric layer 118 extends over both of the portions 110A and 110B. In some embodiments, the gate dielectric layer 118 is made of or includes a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 118 is deposited using an ALD process, a CVD process, a spin-on process, one or more other applicable processes, or a combination thereof. In some embodiments, a high temperature annealing operation is used to reduce or eliminate defects in the gate dielectric layer 118. Many variations and/or modifications can be made to embodiments of the disclosure. In some embodiments, two different gate dielectric layers are formed over the portions 110A and 110B to serve as the gate dielectric layers of different transistors.

In some other embodiments, before the gate dielectric layer 118 is formed, an interfacial layer (not shown) is formed in the trench 116. The interfacial layer may be used to reduce stress between the gate dielectric layer 118 and the fin structures 101A and 101B. In some embodiments, the interfacial layer is made of or includes silicon oxide. In some embodiments, the interfacial layer is formed using an ALD process, a thermal oxidation process, one or more other applicable processes, or a combination thereof.

As shown in FIGS. 1E, 4C, and 5, a barrier layer 120 is deposited over the gate dielectric layer 118, in accordance with some embodiments. The barrier layer 120 may be used to interface the gate dielectric layer 118 with subsequently formed work function layers. The barrier layer 120 may also be used to prevent diffusion between the gate dielectric layer 118 and the subsequently formed work function layers.

In some embodiments, the barrier layer 120 is made of or includes a metal-containing material. The metal-containing material may include titanium nitride, tantalum nitride, one or more other suitable materials, or a combination thereof. In some embodiments, the barrier layer 120 includes multiple layers. In some embodiments, the barrier layer 120 is deposited using an ALD process, a CVD process, a PVD process, an electroplating process, an electroless plating process, one or more other applicable processes, or a combination thereof. In some other embodiments, the barrier layer 120 is not formed. In some embodiments, two different barrier layers are formed over the portions 110A and 110B to serve as the barrier layers of different transistors.

Afterwards, work function layers 122A and 122B are respectively formed over the barrier layer 120, as shown in FIGS. 1E, 4C, and 5 in accordance with some embodiments. The work function layer is used to provide desired work function for transistors to enhance device performance including improved threshold voltage. In the embodiments of forming an NMOS transistor, the work function layer can be an n-type metal layer. The n-type metal layer is capable of providing a work function value suitable for the device, such as equal to or less than about 4.5 eV. The n-type metal layer may include metal, metal carbide, metal nitride, or a combination thereof. For example, the n-type metal layer is made of or includes titanium nitride, tantalum, tantalum nitride, one or more other suitable materials, or a combination thereof.

On the other hand, in the embodiments of forming a PMOS transistor, the work function layer can be a p-type metal layer. The p-type metal layer is capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level. For example, a titanium nitride layer may be used as a p-type metal layer or an n-type metal layer, depending on the thickness and/or the compositions of the titanium nitride layer.

In some embodiments, the work function layer 122A is a p-type metal layer, and the work function layer 122B is an n-type metal layer. In some embodiments, the work function layer 122A is formed before the work function layer 122B. The work function layer 122A is deposited over the barrier layer 120. Afterwards, the work function layer 122A is patterned. For example, the work function layer 122A is positioned over the portion 110A of the semiconductor substrate 100. The portion of the work function layer 122A originally over the portion 110B is removed. For example, a photolithography process and an etching process are used to pattern the work function layer 122A. Similarly, the work function layer 122B is deposited and patterned over the portion 110B of the semiconductor substrate 100.

Many variations and/or modifications can be made to embodiments of the disclosure. In some other embodiments, the work function layer 122B is formed before the work function layer 122A. In some other embodiments, both of the work function layers 122A and 122B have the same conductivity type, such as n-type or p-type.

Afterwards, a blocking layer 124 is deposited over the work function layers 122A and 122B, as shown in FIGS. 1E, 4C, and 5 in accordance with some embodiments. The blocking layer 124 may be used to prevent a subsequently formed metal filling layer from diffusing or penetrating into the work function layers. In some embodiments, the blocking layer 124 is made of or includes tantalum nitride, titanium nitride, one or more other suitable materials, or a combination thereof. In some embodiments, the blocking layer 124 is deposited using an ALD process, a PVD process, an electroplating process, an electroless plating process, one or more other applicable processes, or a combination thereof.

Embodiments of the disclosure are not limited thereto. In some other embodiments, the blocking layer 124 is not formed. In some other embodiments, two different blocking layers are used between the subsequently formed metal filling layers and the different work function layers 122A and 122B.

Afterwards, a metal filling layer 126 is deposited over the blocking layer 124 to fill the trenches 116, as shown in FIGS. 1E, 4C, and 5 in accordance with some embodiments. In some embodiments, the metal filling layer 126 is made of or includes tungsten, aluminum, copper, cobalt, one or more other suitable materials, or a combination thereof. In some embodiments, the metal filling layer 126 is deposited using a PVD process, a CVD process, an electroplating process, an electroless plating process, one or more other applicable processes, or a combination thereof.

Many variations and/or modifications can be made to embodiments of the disclosure. In some other embodiments, the metal filling layer 126 is not formed. In some embodiments, two different metal filling layers are formed over the portions 110A and 110B to serve as the metal filling layers of different transistors.

In some embodiments, a first set of metal gate stack layers are formed over the portion 110A, and the portion 110B is blocked by, for example, a patterned mask. Afterwards, a second set of metal gate stack layers are formed over the portion 110B, and the first set of metal gate stack layers are covered by another patterned mask.

In some embodiments, the metal gate stack layers, including the gate dielectric layer 118, the barrier layer 120, the work function layers 122A and 122B, the blocking layer 124, and the metal filling layer 126, together fill the trenches 116 and cover the dielectric layer 113. In some embodiments, the portion of the metal gate stack layers outside of the trench 116 is removed. For example, a planarization process is used to partially remove the metal gate stack layers until the dielectric layer 113 is exposed. As a result, the metal gate stack layers remaining in the trenches 116 form multiple metal gate stack lines 133, as shown in FIG. 2D. The planarization process may include a CMP process, a grinding process, an etching process, a dry polishing process, one or more other applicable processes, or a combination thereof.

After the formation of the metal gate stack layers in the trenches 116, the metal gate stack layers (or metal gate stack lines) are patterned to form multiple metal gate stacks, in accordance with some embodiments.

Figure 1F:
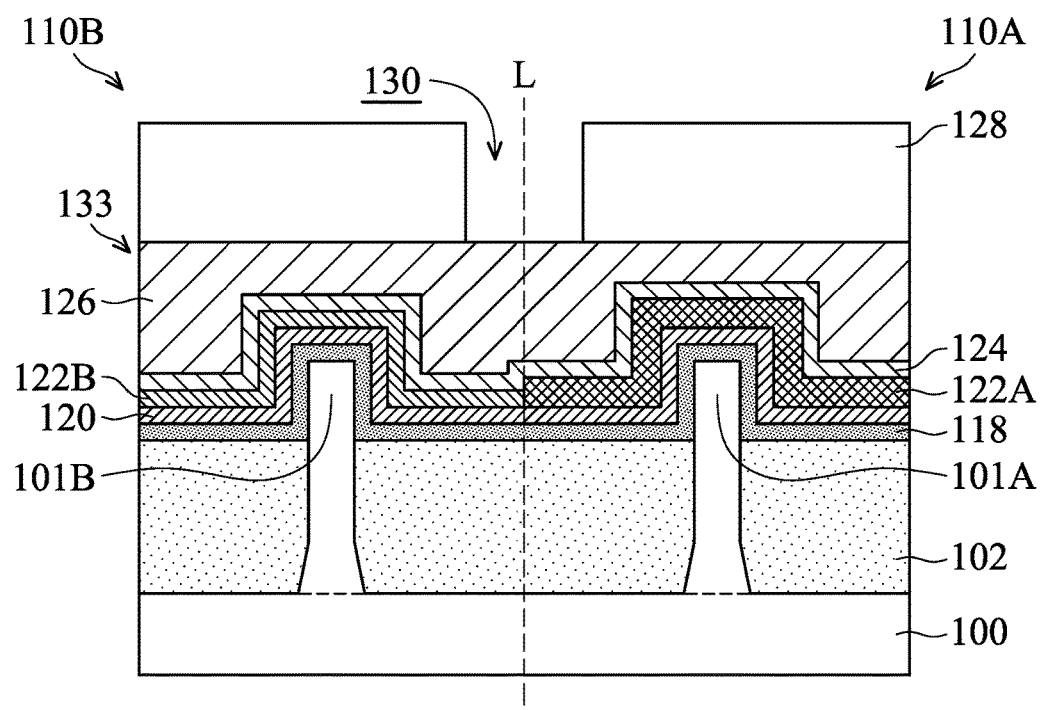

As shown in FIG. 1F, a mask layer 128 is deposited and patterned over the metal filling layer 126 to assist in the patterning of the metal gate stack layers (or metal gate stack lines), in accordance with some embodiments. In some embodiments, the mask layer 128 is made of or includes a photoresist material, silicon nitride, silicon oxynitride, silicon oxide, titanium nitride, silicon carbide, one or more other suitable materials, or a combination thereof. The mask layer 128 may be deposited using a spin-on process, a CVD process, a PVD process, one or more other applicable processes, or a combination thereof. One or more photolithography an etching processes may be used to pattern the mask layer 128.

Figure 6A:
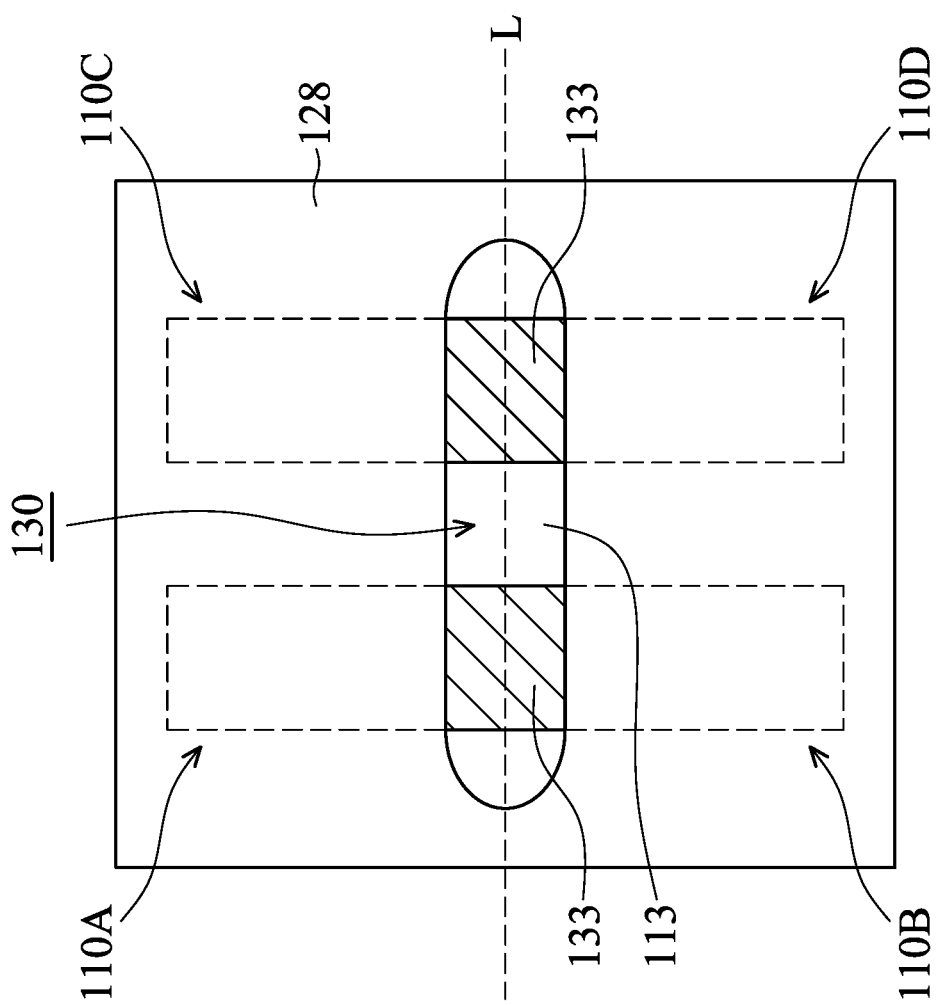
FIGS. 6A and 6B each shows a top view of an intermediate stage of a process for forming a semiconductor device structure, in accordance with some embodiments.
Figure 6B:
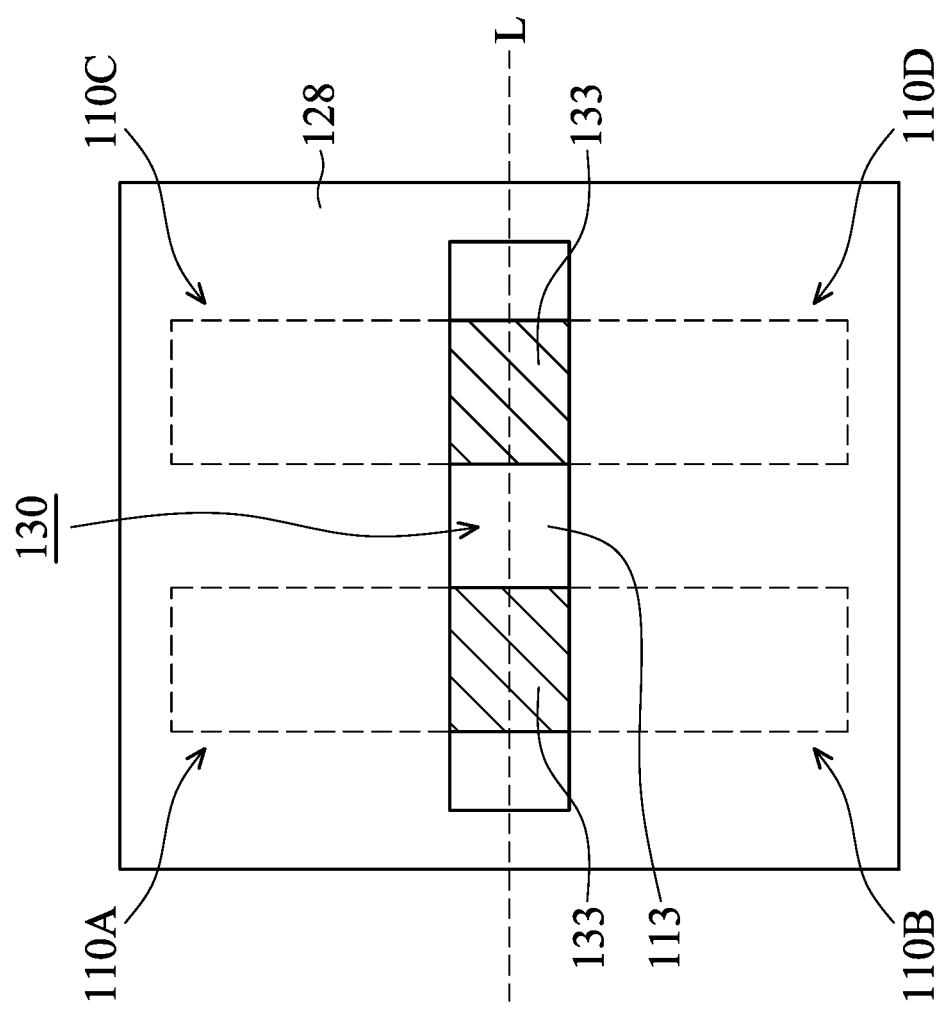

FIGS. 6A and 6B each shows a top view of an intermediate stage of a process for forming a semiconductor device structure, in accordance with some embodiments. In some embodiments, FIGS. 6A and 6B each shows the top view of the structure shown in FIG. 1F.

As shown in FIG. 6A or 6B, the mask layer 128 has an opening 130 which partially exposes two or more of the metal gate stack lines 133, in accordance with some embodiments. The opening 130 also exposes a portion of the dielectric layer 113 between the exposed metal gate stack lines 133. In some embodiments, the top view of the opening 130 is oval, as shown in FIG. 6A. In some other embodiments, the top view of the opening is rectangular, as shown in FIG. 6B. The top view of the opening 130 may have various shapes. For example, the top view of the opening 130 may be square.

Figure 1G:
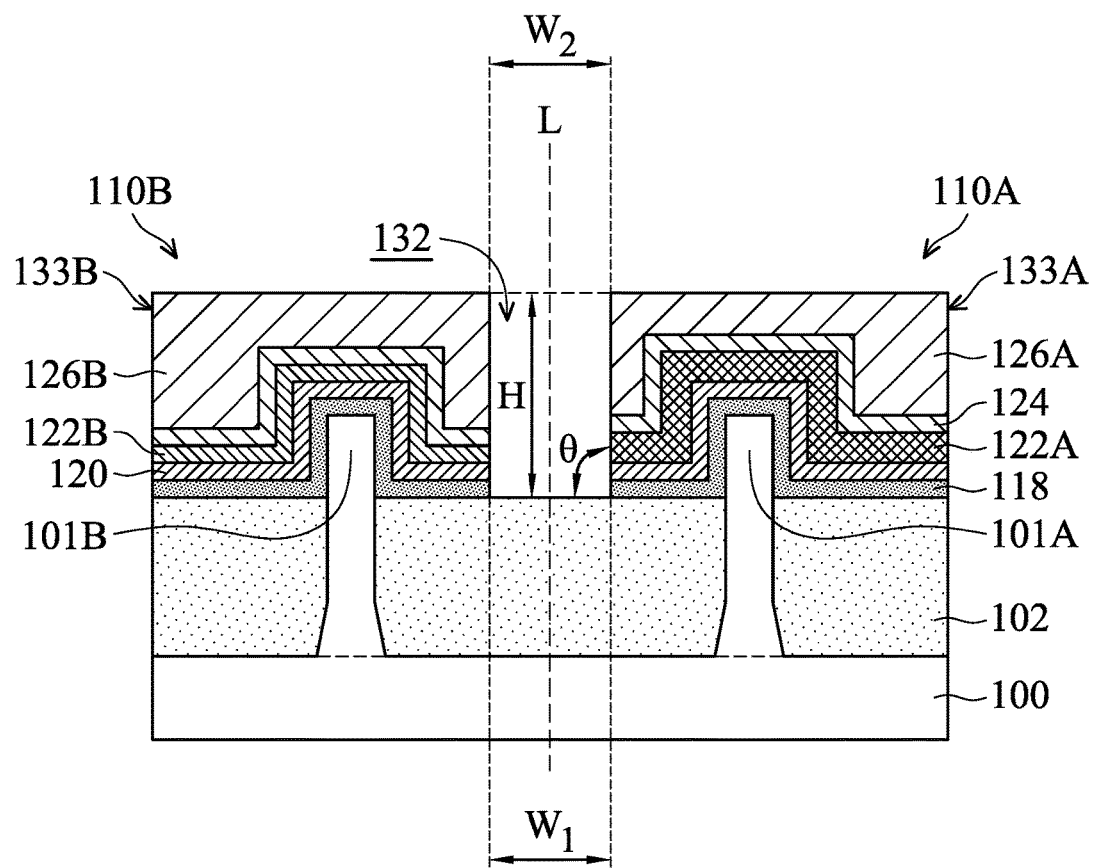
Figure 2E:
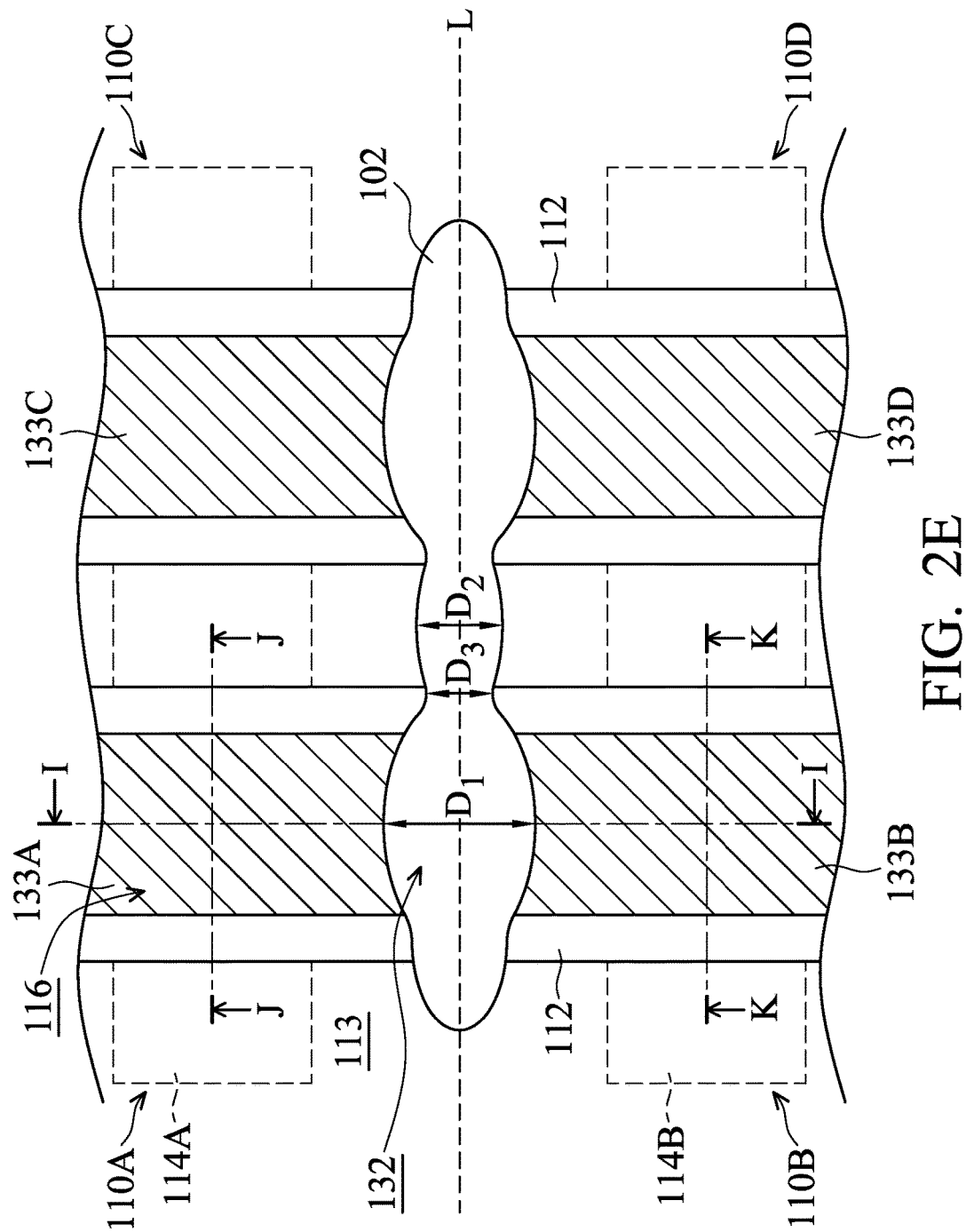

Referring to FIG. 1G, portions of the metal gate stack lines 133 are removed to form a recess 132 in the metal gate stack lines 133, in accordance with some embodiments. FIG. 2E shows the top view of the recess 132. The recess 132 may also be called a cut-metal-gate (CMG) opening. The recess 132 may extend into the dielectric layer 113 and the spacer elements 112 between the metal gate stack lines 133. The mask layer 128 is used to assist in the formation of the recess 132. In some embodiments, the mask layer 128 is removed after the formation of the recess 132. The recess 132 separates each of the metal gate stack lines 133 into two gate stacks, as shown in FIGS. 1G and 2E in accordance with some embodiments. As a result, gate stacks 133A, 133B, 133C, and 133D are formed. In some embodiments, the gate stacks 133A and 133B are not in direct contact with each other. As shown in FIGS. 1G and 2E, the recess 132 exposes the isolation feature 102, in accordance with some embodiments.

The formation of the recess 132 may also be called an end cut process. The end cut process cuts "the metal gate stack line" (or the metal gate stack layers) into multiple separate metal gate stacks. The end cut process is performed after the deposition of the metal gate stack layers. The metal gate stack layers are deposited in the trench 116 which is large enough to contain two or more gate stacks and has a relatively low aspect ratio. Therefore, the deposition of the metal gate stack layers can be performed well. The quality and reliability of the metal gate stack layers are improved significantly. The size, the profile, and the position of the recess 132 may be controlled more precisely. As a result, problems such as short circuiting or current leakage are reduced or prevented.

As shown in FIG. 1G, the recess 132 has an upper width $W_2$, a lower width $W_1$, and a height H. In some embodiments, the width $W_1$ is equal to the width $W_2$. However, embodiments of the disclosure are not limited thereto. In some other embodiments, the width $W_2$ is greater than the width $W_1$. In some embodiments, the width $W_1$ is greater than the width $W_2$.

By varying the etching conditions for forming the recess 132, the profile of the recess 132 can be fine-tuned. For example, an angle θ between a sidewall and a bottom of the recess 132 may be tuned by varying the etching conditions. In some embodiments, the angle θ is substantially equal to about 90 degrees. In these cases, the recess 132 has vertical sidewalls. In some other embodiments, the angle θ is greater than 90 degrees. In some other embodiments, the angle θ is smaller than 90 degrees. In these cases, the recess 132 has slanted sidewalls.

In some embodiments, the recess 132 is formed using an etching process. A gas mixture may be used in the etching process. The gas mixture may include $Cl_2$, HBr, $BCl_3$, $SiCl_4$, $NF_3$, $N_2$, $CF_4$, $CH_2F_2$, $O_2$, Ar, $N_2H_2$, $CH_4$, $SF_6$, one or more other suitable gases, or a combination thereof. During the etching operations, the composition of the gas mixture may be varied according to the requirements.

As shown in FIG. 2E, the top view of the recess 132 shows that the recess has different sizes at different regions, in accordance with some embodiments. The etching process for forming the recess 132 may etch the metal gate stack lines 133 and the dielectric layer 113 at different etching rates. For example, the etching process etches the metal gate stack lines 133 at a first rate and etches the dielectric layer 113 at a second rate. In some embodiments, the first rate is greater than the second rate. Since the metal gate stack lines 133 are etched at a greater rate, the recess 132 has a larger size at the regions originally occupied by the metal gate stack lines 133. As shown in FIG. 2E, the width $D_1$ of the recess 132 is greater than the width $D_2$ of the recess 132. In some embodiments, the recess 132 has a curved profile. In some embodiments, the width of the recess 132 gradually decreases from the width $D_1$ to the width $D_3$ and gradually increases from the width $D_3$ to the width $D_2$, as shown in FIG. 2E.

However, embodiments of the disclosure have many variations and/or modifications. The top view of the recess 132 is not limited to be that shown in FIG. 2E. In some other embodiments, the top view of the recess 132 is the same as or similar to the embodiments shown in FIG. 7A. The embodiments shown in FIG. 7A will be illustrated in more detail later.

Figure 1H:
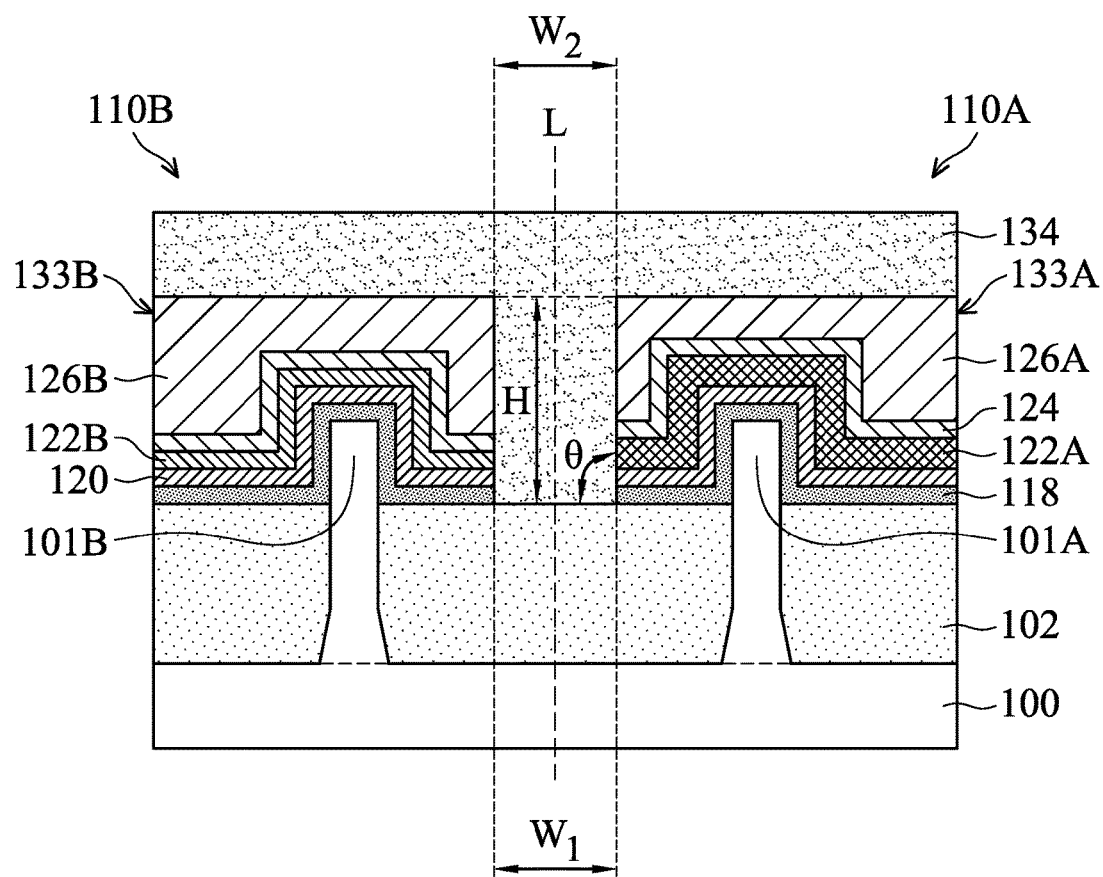

As shown in FIG. 1H, a dielectric layer 134 is deposited over the gate stacks (and the dielectric layer 113) to fill the recess 132, in accordance with some embodiments. The dielectric layer 134 may overfills the recess 132. In some embodiments, the dielectric layer 134 is made of or includes silicon nitride, silicon oxide, silicon oxynitride, carbon-containing silicon oxide, one or more other suitable dielectric materials, or a combination thereof. In some embodiments, the material of the dielectric layer 134 is different from that of the dielectric layer 113 which surrounds the gate stacks 133A-133D.

However, embodiments of the disclosure are not limited thereto. In some other embodiments, the materials of the dielectric layer 134 and the dielectric layer 113 are substantially the same. The dielectric layer 134 may also be used as a stressor layer that improves the carrier mobility of the fin structures 101A and 101B. In some embodiments, the dielectric layer 134 is made of a material that has higher stress than that of the dielectric layer 113.

In some embodiments, the dielectric layer 134 is a single layer. In some other embodiments, the dielectric layer 134 has a multi-layered structure. In these cases, the dielectric layer 134 includes multiple sub-layers. In some embodiments, some or all of the sub-layers are made of different materials. In some other embodiments, some or all of the sub-layers are made of the same material.

In some embodiments, the dielectric layer 134 is formed using a deposition process suitable for filling a recess or an opening. In some embodiments, the dielectric layer 134 is deposited using an ALD process, a flowable chemical vapor deposition (FCVD) process, a CVD process, one or more other applicable processes, or a combination thereof. In some other embodiments, a spin-on process is used to form the dielectric layer 134.

Figure 1I:
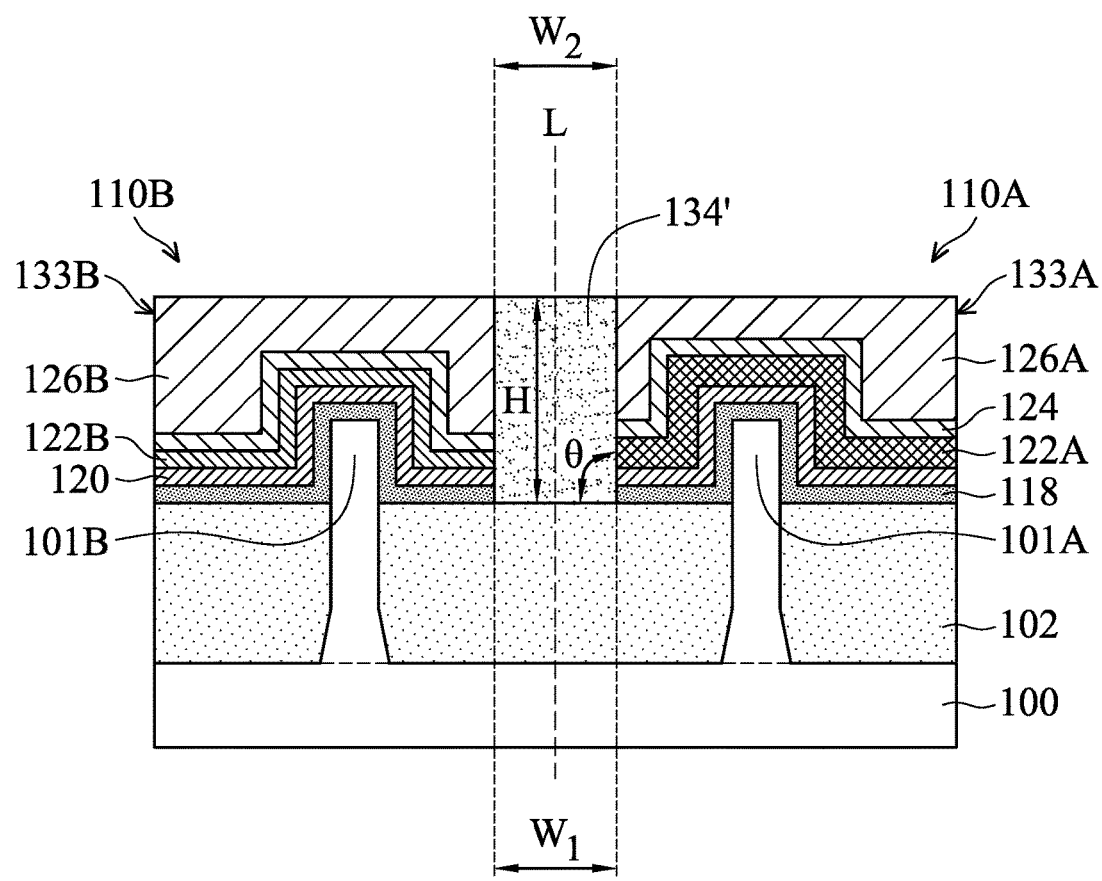

Afterwards, the portion of the dielectric layer 134 outside of the recess 132 is removed until the metal gate stacks are exposed, as shown in FIG. 1I in accordance with some embodiments. In some embodiments, a planarization process is used to partially remove the dielectric layer 134. The planarization process may include a CMP process, a grinding process, an etching process, one or more other applicable processes, or a combination thereof. As a result, the portion of the dielectric layer 134 remaining in the recess 132 forms an insulating structure 134', as shown in FIG. 1I in accordance with some embodiments.

Many variations and/or modifications can be made to embodiments of the disclosure. In some embodiments, the insulating structure 134' includes a multilayer structure. For example, multiple dielectric layers are deposited to fill the recess 132. Similarly, a planarization process may be performed to remove the multiple dielectric layers outside of the recess 132. As a result, the multiple dielectric layers remaining in the recess 132 form the insulating structure 134'.

Figure 2F:
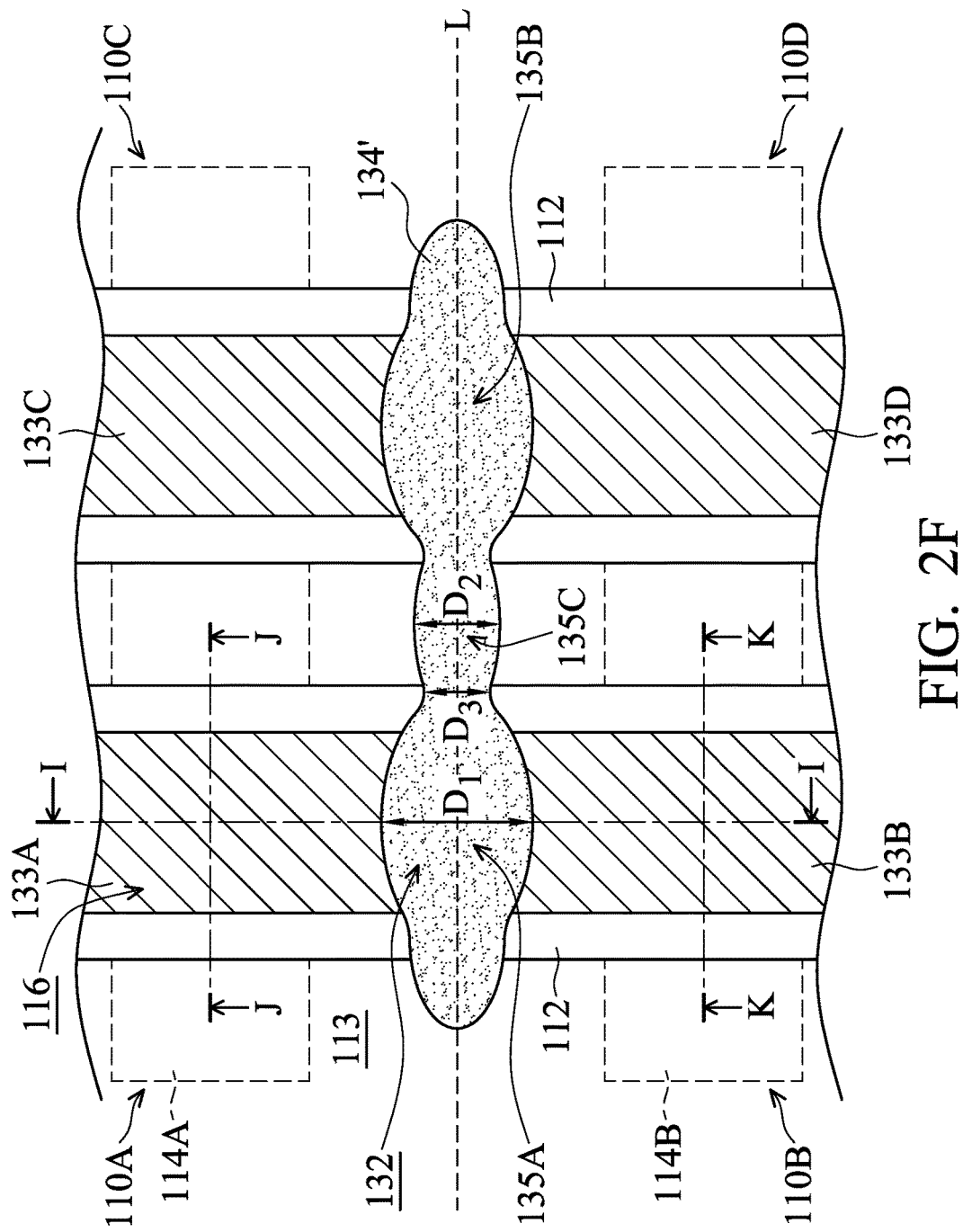

As shown in FIG. 1I, the insulating structure 134' is adjacent to the gate stacks 133A and 133B, in accordance with some embodiments. As shown in FIG. 2F, the insulating structure 134' is also adjacent to the gate stacks 133C and 133D. In some embodiments, the insulating structure 134' is in direct contact with the work function layers 122A and 122B and the metal fillings 126A and 126B of the gate stacks 133A and 133B, as shown in FIG. 1I. The insulating structure 134' is also in direct contact with the work function layers and the metal fillings of the gate stacks 133C and 133D.

In some embodiments, the insulating structure 134' also in direct contact with the gate dielectric layer 120 of the gate stacks 133A and 133B, as shown in FIG. 1I. The insulating structure 134' is also in direct contact with the gate dielectric layer of the gate stacks 133C and 133D. In some embodiments, the insulating structure 134' is also in direct contact with the isolation feature 102, as shown in FIG. 1I. In some embodiments, the insulating structure 134' is in direct contact with the spacer elements 112, as shown in FIG. 2F.

As shown in FIG. 2F, transistors each including the gate stacks 133A, 133B, 133C, and 133D are formed, in accordance with some embodiments. The insulating structure 134' is formed between the ends of the gate stacks 133A and 133B to electrically isolate the gate stack 133A from the gate stack 133B. The insulating structure 134' is also formed between the ends of the gate stacks 133C and 133D to electrically isolate the gate stack 133C from the gate stack 133D. The gate dielectric layer and the work function layer are in direct contact with lower portions of the insulating structure 134'. The metal fillings are in direct contact with an upper portion of the insulating structure 134'. Because each of the gate stacks is formed by patterning the metal gate stack layers, the height of the gate stack may be well controlled. In some embodiments, no planarization needs to be performed to ensure that different gate stacks have the same height. Therefore, the associated processing cost and processing time are reduced. The residue generated during the planarization process is also reduced.

In some embodiments, the insulating structure 134' has a first portion 135A that is between the gate stacks 133A and 133B, as shown in FIG. 2F. The first portion 135A of the insulating structure 134' penetrates through one of the metal gate stack lines 133 and divides it into at least two separate gate stacks. The first portion 135A of the insulating structure 134' is in direct contact with the work function layers and metal fillings of the gate stacks 133A and 133B. The insulating structure 134' also has a second portion 135B that is between the gate stacks 133C and 133D. The second portion 135B of the insulating structure 134' is in direct contact with the work function layers and metal fillings of the gate stacks 133C and 133D. The insulating structure 134' further has a third portion 135C that links the first portion 135A and the second portion 135B, as shown in FIG. 2F. The third portion 135C of the insulating structure 134' is in direct contact with the dielectric layer 113.

Many variations and/or modifications can be made to embodiments of the disclosure. The etching process for forming the recess 132 may be fine-tuned to modify the profile of the recess 132.

Figure 7A:
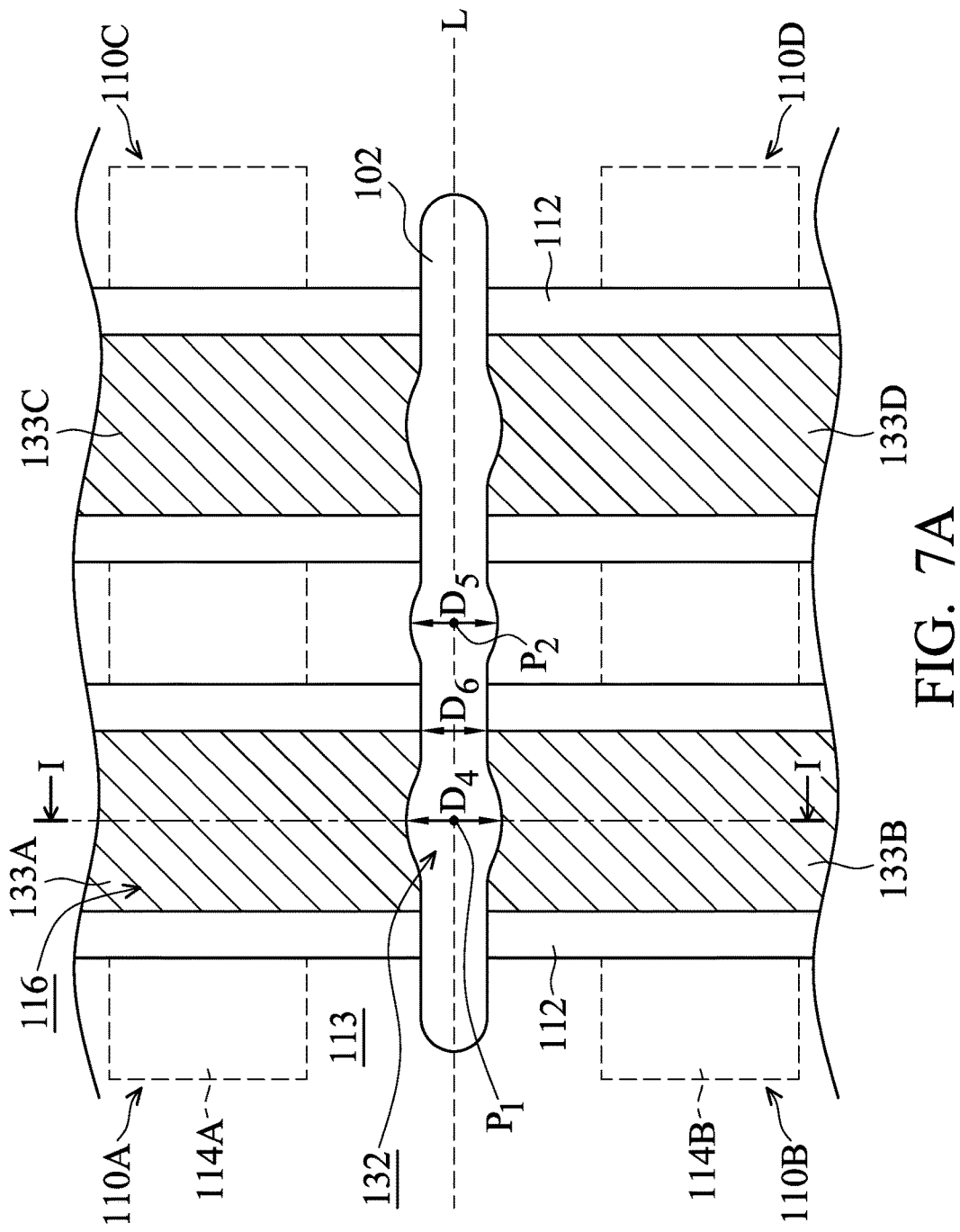
FIGS. 7A-7B are top views of various stages of a process for forming a semiconductor device structure, in accordance with some embodiments.
Figure 7B:
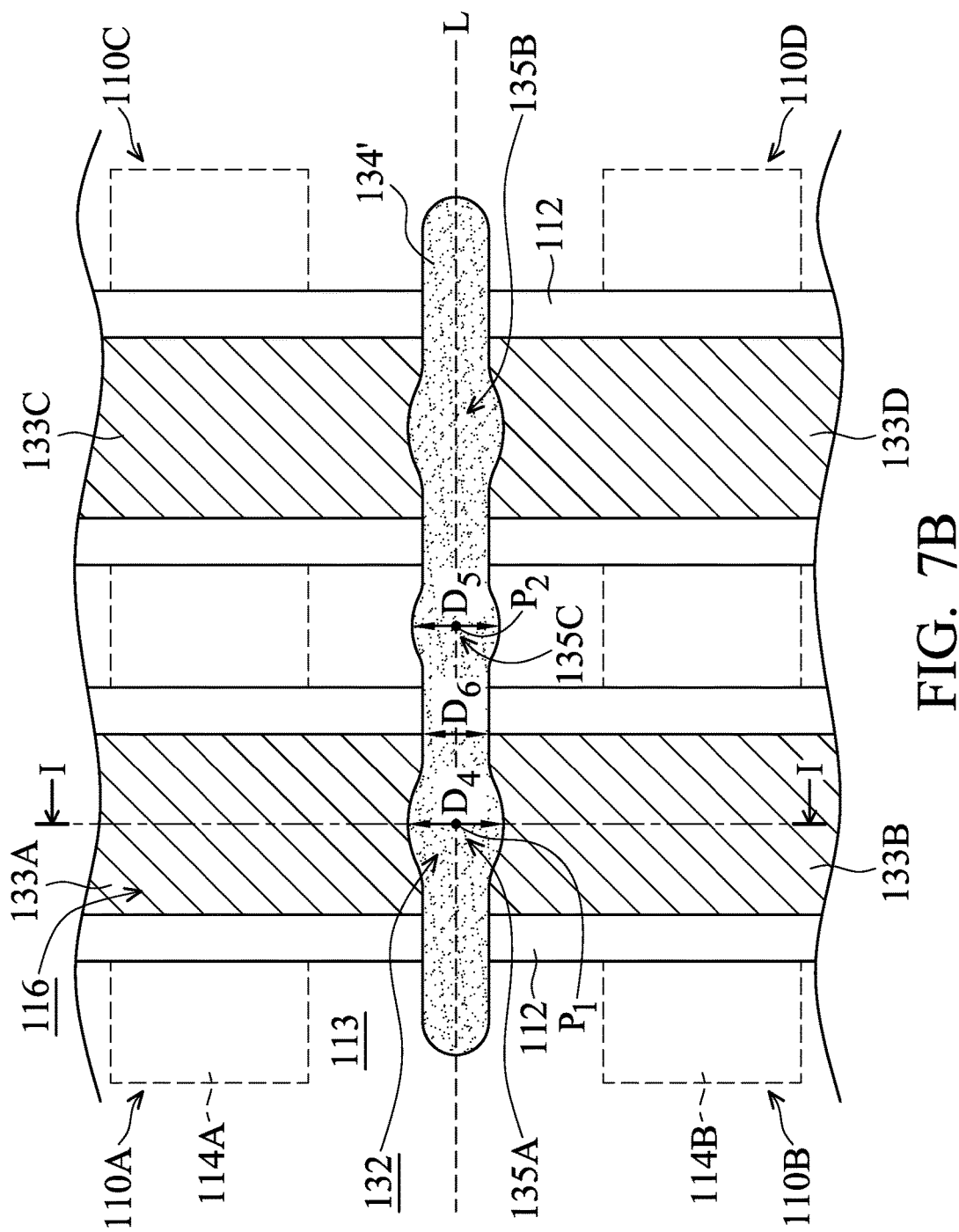
Figure 8A:
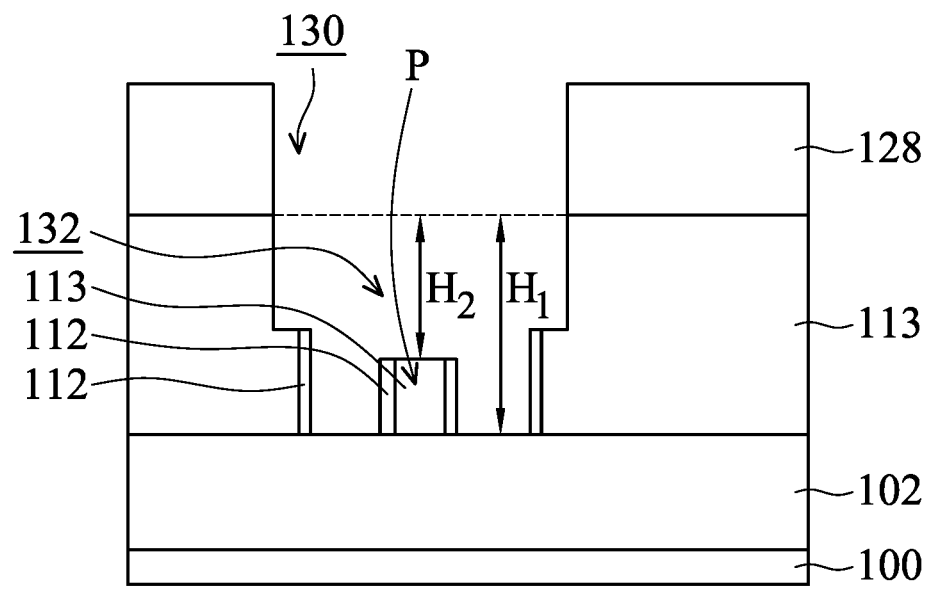
FIGS. 8A-8C are cross-sectional views of various stages of a process for forming a semiconductor device structure, in accordance with some embodiments.
Figure 8B:
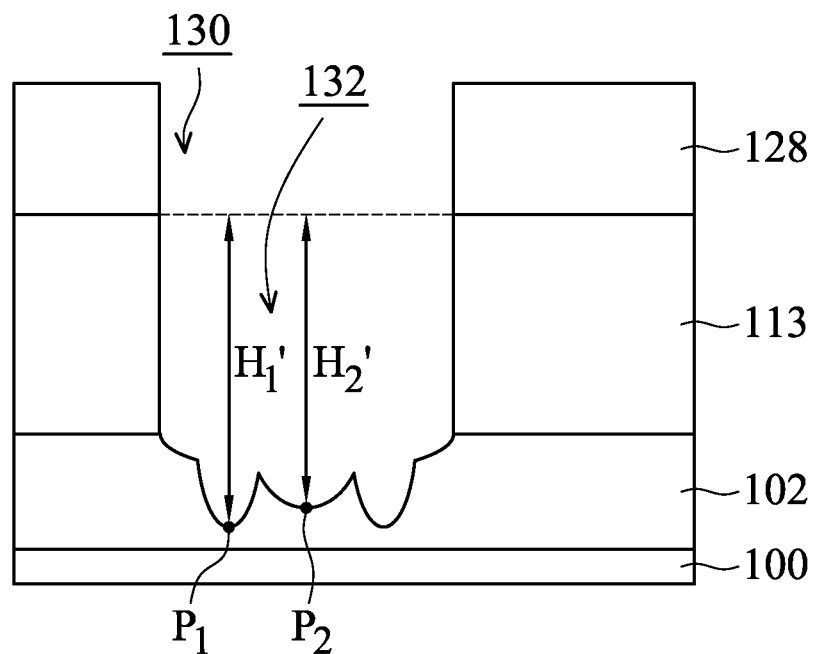
Figure 8C:
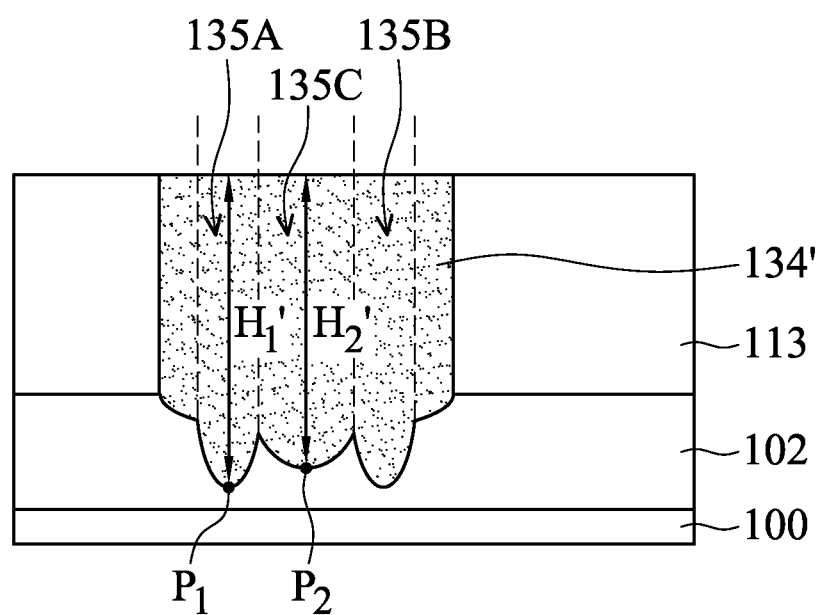

FIGS. 7A-7B are top views of various stages of a process for forming a semiconductor device structure, in accordance with some embodiments. FIGS. 8A-8C are cross-sectional views of various stages of a process for forming a semiconductor device structure, in accordance with some embodiments. In some embodiments, FIG. 7A shows the top view of the structure shown in FIG. 1G and other portions that are not shown in FIG. 1G. FIG. 1G may be the cross-sectional view taken along the line I-I in FIG. 7A. In some embodiments, FIG. 8A shows a cross-sectional view taken along the line L in FIG. 7A.

The etching process for forming the recess 132 may be fine-tuned to ensure that no metal residue is left to electrically connect the gate stacks that are not intended to be shorted together. In some embodiments, the reaction gas used in the etching process includes $BCl_3$, $Cl_2$, $SiCl_4$, another suitable gas, or a combination thereof. In some embodiments, the etching process for forming the recess 132 is tuned to be more isotropic. The etching rate of a dielectric material may be increased. Therefore, the spacer elements 112 and the dielectric layer 113 in the recess 132 may be removed more easily. The metal reside originally adhered on the surfaces of these dielectric materials may thus be removed. In some embodiments, the recess 132 has an oval-like top view shape, as shown in FIG. 7A. As shown in FIG. 7A, the width $D_4$ of the recess 132 in a plane view is slightly greater than the width $D_5$ of the recess 132 in the plane view. In some embodiments, the width of the recess 132 gradually decreases from the width $D_4$ to the width $D_6$ and gradually increases from the width $D_6$ to the width $D_5$, as shown in FIG. 7A. In some embodiments, the top view of the recess 132 is oval or rectangular, as shown in FIG. 7A. The profile of the recess 132 may be oval-like or rectangle-like.

In some embodiments, the width ratio ($D_6/D_4$) of the recess 132 is in a range from about 0.7 to about 1. In some cases, if the width ratio ($D_6/D_4$) is smaller than about 0.7, the metal residue may remain on sidewalls of the recess 132. This metal residue may cause short circuiting between the gate stacks that are intended to be separated by the recess 132.

As shown in FIG. 7A, the recess 132 completely cuts through the metal gate stack lines 133, in accordance with some embodiments. As a result, the gate stacks 133A, 133B, 133C, and 133D are formed. As shown in FIG. 8A, the recess 132 has a first portion that penetrates through the metal gate stack line 133. The first portion of the recess 132 has a depth $H_1$. In some embodiments, the dielectric layer 113 has a portion P that remains in the recess 132. The recess 132 also has a second portion that extends into the dielectric layer 113. The second portion of the recess 132 has a depth $H_2$. The depth $H_1$ is greater than the depth $H_2$.

Many variations and/or modifications can be made to embodiments of the disclosure. In some embodiments, the formation of the recess 132 further includes over-etching the metal gate stack lines 133. The dielectric layer 113 may also be over-etched. As shown in FIG. 8B, after the over-etching process, the portion P of the dielectric layer 113 is removed, in accordance with some embodiments. In some embodiments, FIG. 8B shows the cross-sectional view of the structure shown in FIG. 7A taken along the line L after the over-etching process.

Due to the over-etching process, not only is the portion P of the dielectric layer 113 removed, but any metal residue that might remain on the sidewalls of the portion P are also removed. As shown in FIG. 7A, since metal residue formed while cutting the metal gate stack lines 133 is substantially removed, the gate stacks 133A and 133B are sure to be electrically isolated from each other by the recess 132, in accordance with some embodiments. Similarly, the gate stacks 133C and 133D are also electrically isolated from each other by the recess 132.

In some embodiments, due to the over-etching process, the recess 132 further extends into the isolation feature 102 below the dielectric layer 113, as shown in FIG. 8B. The over-etching process may also remove portions of the isolation feature 102. As shown in FIG. 8B, after the over-etching process, the recess 132 has a first portion that extends into the isolation feature 102 originally below the metal gate stack line 133. The first portion of the recess 132 has a depth $H_1'$ at the position $P_1$. The recess 132 also has a second portion that extends into the isolation feature 102 originally below the portion P of the dielectric layer 113. The second portion of the recess 132 has a depth $H_2'$ at the position $P_2$. The depth $H_1'$ is greater than the depth $H_2'$. Therefore, the recess 132 extends deeper into a first portion of the isolation feature 102 (originally below the metal gate stack line 133) than into a second portion of the isolation feature 102 (originally below the portion P of the dielectric layer 113). In some other embodiments, the recess 132 extends into the first portion of the isolation feature 102 (originally below the metal gate stack line 133) without extending into the second portion of the isolation feature 102 (originally below the portion P of the dielectric layer 113).

Afterwards, the insulating structure 134' is formed in the recess 132, as shown in FIGS. 7B and 8C in accordance with some embodiments. The formation of the insulating structure 134' may be the same as or similar to those illustrated in FIGS. 1H, 1I, 2E, and 2F. In some embodiments, the insulating structure 134' has an oval-like top view shape, as shown in FIG. 7B. In some embodiments, the insulating structure 134' penetrates through the dielectric layer 113. In some embodiments, the insulating structure 134' extends into the isolation feature 102.

Figure 9:
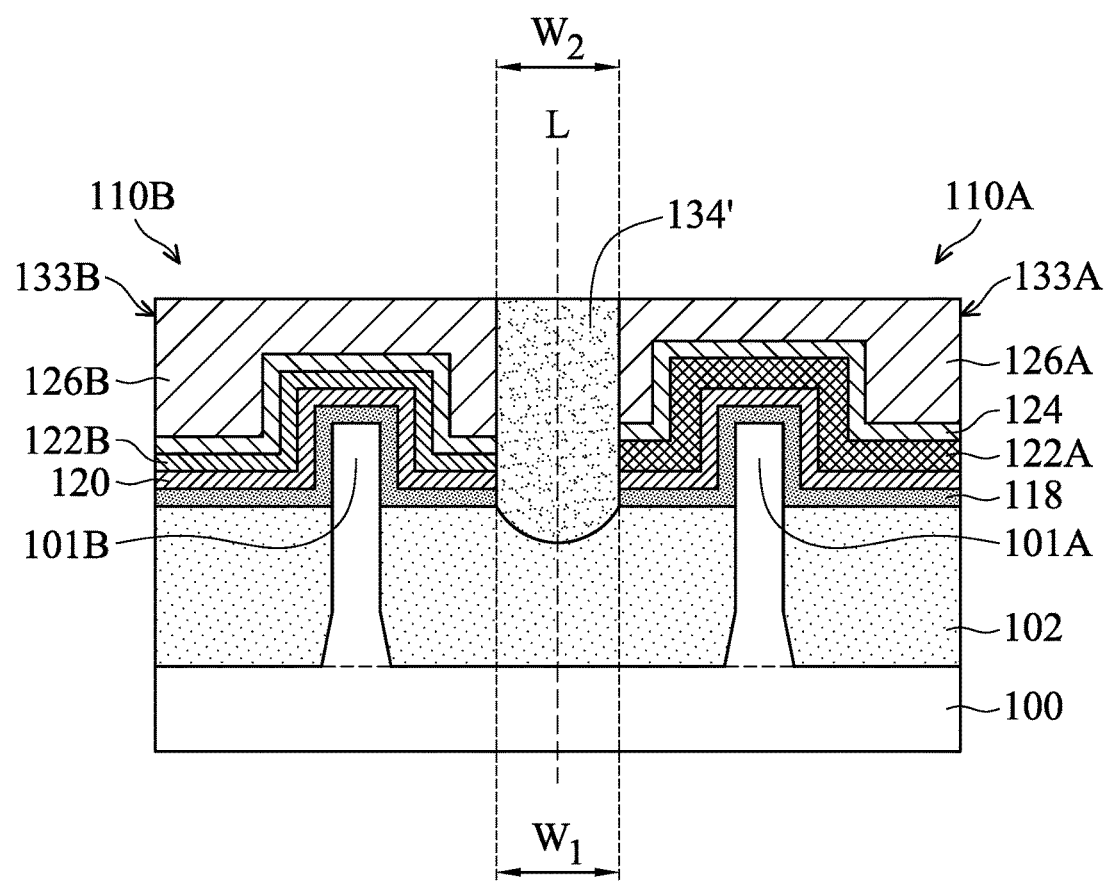
FIG. 9 is a cross-sectional view of a semiconductor device structure, in accordance with some embodiments.

FIG. 9 is a cross-sectional view of a semiconductor device structure, in accordance with some embodiments. In some embodiments, FIG. 9 shows the cross-sectional view of the structure shown in FIG. 7B when taken along the line I-I. The insulating structure 134' extends into the isolation feature 102.

As shown in FIG. 7B, in some embodiments, the insulating structure 134' has a first portion 135A that is between the gate stacks 133A and 133B. The first portion 135A of the insulating structure 134' penetrates through one of the metal gate stack lines 133. In some embodiments, the first portion 135A of the insulating structure 134' is in direct contact with the work function layers and metal fillings of the gate stacks 133A and 133B. The insulating structure 134' also has a second portion 135B that is between the gate stacks 133C and 133D. In some embodiments, the second portion 135B of the insulating structure 134' is in direct contact with the work function layers and the metal fillings of the gate stacks 133C and 133D. The insulating structure 134' further has a third portion 135C that links the first portion 135A and the second portion 135B, as shown in FIG. 7B. In some embodiments, the third portion 135C of the insulating structure 134' is in direct contact with the dielectric layer 113. In some embodiments, the first portion 135A of the insulating structure 134' is thicker than the third portion 135C of the insulating structure 134', as shown in FIGS. 7B and 8C.

Embodiments of the disclosure form a semiconductor device structure with metal gate stacks and fin structures. Multiple dummy gate stack lines are removed to form trenches surrounded by a dielectric layer. Each of the trenches is large enough to contain two or more metal gate stacks of different (or the same) transistors. Metal gate stack lines are formed to fill the trenches. Afterwards, a cut metal gate opening is formed to cut through two or more metal gate stack lines so as to separate each of the metal gate stack lines into two or more metal gate stacks. The cut metal gate opening may also extend into the dielectric layer between the metal gate stack lines. An insulating structure is formed afterwards in the cut metal gate stack opening to electrically isolate the metal gate stacks. Since the metal gate stack layers are deposited in a trench which is large enough to contain two or more gate stacks, the deposition of the metal gate stack layers can be performed well. The quality and the reliability of the metal gate stack layers are improved significantly.

In accordance with some embodiments, a method for forming a semiconductor device structure is provided. The method includes forming a first dummy gate stack and a second dummy gate stack over a semiconductor substrate. The method also includes forming a dielectric layer over the semiconductor substrate to surround the first dummy gate stack and the second dummy gate stack. The method further includes removing the first dummy gate stack and the second dummy gate stack to form a first trench and a second trench in the dielectric layer. In addition, the method includes removing the first dummy gate stack and the second dummy gate stack to form a first trench and a second trench in the dielectric layer. The method also includes partially removing the first metal gate stack, the second metal gate stack, and the dielectric layer to form a recess. The recess penetrates through the first metal gate stack and the second metal gate stack. The method further includes forming an insulating structure to completely or partially fill the recess.

In accordance with some embodiments, a method for forming a semiconductor device structure is provided. The method includes forming an isolation feature over a semiconductor substrate. The method includes forming a dielectric layer over the semiconductor substrate and the isolation feature and forming a first metal gate stack line and a second metal gate stack line over the semiconductor substrate. The first metal gate stack line and the second metal gate stack line are surrounded by the dielectric layer. The method also includes forming an opening such that each of the first metal gate stack line and the second metal gate stack line is separated into at least two separate metal gate stacks. The method further includes forming an insulating structure in the opening, and the insulating structure extends into the isolation structure.

In accordance with some embodiments, a semiconductor device structure is provided. The semiconductor device structure includes a semiconductor substrate and a first, a second, a third, and a fourth metal gate stack over the semiconductor substrate. The semiconductor device structure also includes a dielectric layer surrounding the first, the second, the third, and the fourth metal gate stacks. The semiconductor device structure further includes an insulating structure over the semiconductor substrate. The insulating structure has a first portion between the first metal gate stack and the second metal gate stacks. The insulating structure has a second portion between the third metal gate stack and the fourth metal gate stack. The insulating structure has a third portion linking the first portion and the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first dummy gate stack and a second dummy gate stack over a semiconductor substrate;
   forming a dielectric layer over the semiconductor substrate to surround the first dummy gate stack and the second dummy gate stack;
   removing the first dummy gate stack and the second dummy gate stack to form a first trench and a second trench in the dielectric layer;
   respectively forming a first metal gate stack and a second metal gate stack in the first trench and the second trench;
   partially removing the first metal gate stack, the second metal gate stack, and the dielectric layer to form a recess, wherein the recess penetrates through the first metal gate stack and the second metal gate stack; and
   forming an insulating structure to at least partially fill the recess, wherein the insulating structure has a first portion between two parts of the first metal gate stack, a second portion between two parts of the second metal gate stack, and a third portion linking the first portion and the second portion.

2. The method for forming a semiconductor device structure as claimed in claim 1, further comprising forming an isolation feature over the semiconductor substrate before the first dummy gate stack and the second dummy gate stack are formed, wherein the recess extends into the isolation feature.

3. The method for forming a semiconductor device structure as claimed in claim 2, wherein the recess extends deeper into a first portion of the isolation feature than into a second portion of the isolation feature.

4. The method for forming a semiconductor device structure as claimed in claim 2, further comprising over-etching the first metal gate stack, the second metal gate stack, and the dielectric layer so that the recess extends into the isolation feature.

5. The method for forming a semiconductor device structure as claimed in claim 1, wherein the recess is formed using an etching process, and reaction gas used in the etching process comprises $BCl_3$, $Cl_2$, $SiCl_4$, or a combination thereof.

6. The method for forming a semiconductor device structure as claimed in claim 5, further comprising forming a mask layer over the dielectric layer, the first metal gate stack, and the second metal gate stack, wherein the mask layer has an opening partially exposing the first metal gate stack, the second metal gate stack, and the dielectric layer.

7. The method for forming a semiconductor device structure as claimed in claim 6, wherein a top view of the opening is oval or rectangular.

8. The method for forming a semiconductor device structure as claimed in claim 5, wherein the etching process etches the first metal gate stack at a first rate and etches the dielectric layer at a second rate, and the first rate is greater than the second rate.

9. The method for forming a semiconductor device structure as claimed in claim 1, wherein the insulating structure and the dielectric layer are made of different materials.

10. The method for forming a semiconductor device structure as claimed in claim 1, further comprising forming a first semiconductor fin and a second semiconductor fin over the semiconductor substrate before the first dummy gate stack and the second dummy gate stack are formed, wherein the first dummy gate stack and the second dummy gate stack cover portions of the first semiconductor fin and the second semiconductor fin.

11. A method for forming a semiconductor device structure, comprising:
   forming an isolation feature over a semiconductor substrate;
   forming a dielectric layer over the semiconductor substrate and the isolation feature;
   forming a first metal gate stack line and a second metal gate stack line over the semiconductor substrate, wherein the first metal gate stack line and the second metal gate stack line are surrounded by the dielectric layer;
   forming an opening such that each of the first metal gate stack line and the second metal gate stack line is separated into at least two separate metal gate stacks; and
   forming an insulating structure in the opening, wherein the insulating structure has a first portion between two parts of the first metal gate stack line, a second portion between two parts of the second metal gate stack line, and a third portion linking the first portion and the second portion.

12. The method for forming a semiconductor device structure as claimed in claim 11, wherein the opening extends into the dielectric layer between the first metal gate stack line and the second metal gate stack line.

13. The method for forming a semiconductor device structure as claimed in claim 11, wherein the opening has a first portion penetrating through the first metal gate stack line and a second portion extending into the dielectric layer, and the first portion of the opening has a greater depth than the second portion of the opening.

14. A semiconductor device structure, comprising:
   a semiconductor substrate;
   a first, a second, a third, and a fourth metal gate stack over the semiconductor substrate;
   a dielectric layer surrounding the first, the second, the third, and the fourth metal gate stacks; and
   an insulating structure over the semiconductor substrate, wherein the insulating structure has a first portion between the first metal gate stack and the second metal gate stacks, a second portion between the third metal gate stack and the fourth metal gate stack, and a third portion linking the first portion and the second portion.

15. The semiconductor device structure as claimed in claim 14, wherein a first width of the first portion of the insulating structure in a plane view is greater than a second width of the third portion of the insulating structure in the plane view.

16. The semiconductor device structure as claimed in claim 14, wherein the insulating structure penetrates through the dielectric layer.

17. The semiconductor device structure as claimed in claim 14, wherein the first portion is thicker than the third portion.

18. The semiconductor device structure as claimed in claim 14, further comprising an isolation feature over the semiconductor substrate and below the first, the second, the third, and the fourth metal gate stacks, wherein the insulating structure extends into the isolation feature.

19. The semiconductor device structure as claimed in claim 14, wherein:
   the first metal gate stack has a first work function layer and a first metal filling,
   the second metal gate stack has a second work function layer and a second metal filling, and
   the first portion of the insulating structure is in direct contact with the first work function layer, the first metal filling, the second work function layer, and the second metal filling.

20. The semiconductor device structure as claimed in claim 14, wherein the insulating structure and the dielectric layer are made of different materials.

* * * * *